(12) United States Patent
Hirukawa et al.

(10) Patent No.: US 8,343,693 B2
(45) Date of Patent: Jan. 1, 2013

(54) FOCUS TEST MASK, FOCUS MEASUREMENT METHOD, EXPOSURE METHOD AND EXPOSURE APPARATUS

(75) Inventors: Shigeru Hirukawa, Tokyo (JP); Shinjiro Kondo, Kounosu (JP)

(73) Assignee: Nikon Corporation, Tokyo (JP)

( * ) Notice: Subject to any disclaimer, the term of this patent is extended or adjusted under 35 U.S.C. 154(b) by 225 days.

(21) Appl. No.: 12/940,292

(22) Filed: Nov. 5, 2010

(65) Prior Publication Data

US 2011/0212389 A1 Sep. 1, 2011

Related U.S. Application Data

(60) Provisional application No. 61/272,899, filed on Nov. 17, 2009.

(30) Foreign Application Priority Data

Nov. 5, 2009 (JP) ................................. 2009-253785

(51) Int. Cl.
*G03F 1/26* (2012.01)
*G03F 1/44* (2012.01)

(52) U.S. Cl. .................. 430/5; 430/22; 430/30; 355/53; 382/151

(58) Field of Classification Search ................ 430/5, 22, 430/30; 355/53; 382/151
See application file for complete search history.

(56) References Cited

U.S. PATENT DOCUMENTS

| | | | |
|---|---|---|---|
| 5,300,786 A | 4/1994 | Brunner et al. | |
| 5,300,789 A | 4/1994 | Gorfinkel et al. | |
| 5,448,332 A | 9/1995 | Sakakibara et al. | |
| 5,948,571 A | 9/1999 | Mih et al. | |
| 5,969,441 A | 10/1999 | Loopstra et al. | |
| 6,208,407 B1 | 3/2001 | Loopstra | |
| 6,535,280 B1 | 3/2003 | La Fontaine et al. | |
| 6,590,634 B1 | 7/2003 | Nishi et al. | |
| 6,674,511 B2 | 1/2004 | Nomura et al. | |
| 6,710,853 B1 | 3/2004 | La Fontaine et al. | |
| 6,811,939 B2 | 11/2004 | Nakao et al. | |
| 6,897,963 B1 | 5/2005 | Taniguchi et al. | |
| 6,940,585 B2 | 9/2005 | Nomura et al. | |
| 7,426,017 B2 | 9/2008 | Kondo | |
| 2002/0021434 A1 | 2/2002 | Nomura et al. | |
| 2002/0041377 A1 | 4/2002 | Hagiwara et al. | |
| 2003/0031943 A1 | 2/2003 | Nakao et al. | |
| 2003/0052890 A1 | 3/2003 | Raskar et al. | |
| 2005/0036122 A1 | 2/2005 | Nomura et al. | |
| 2005/0112475 A1 | 5/2005 | Sato et al. | |
| 2006/0019180 A1 | 1/2006 | Nomura | |
| 2006/0103825 A1 | 5/2006 | Kondo | |
| 2007/0242247 A1 | 10/2007 | Shiraishi | |
| 2009/0098473 A1 | 4/2009 | Sato et al. | |
| 2009/0190118 A1 | 7/2009 | Fukuhara | |
| 2009/0263733 A1 | 10/2009 | Nomura | |

FOREIGN PATENT DOCUMENTS

| | | |
|---|---|---|
| EP | 1 420 298 A2 | 5/2004 |
| JP | A-3-191347 | 8/1991 |
| JP | A-6-204305 | 7/1994 |
| JP | A-8-304999 | 11/1996 |
| JP | A-9-329888 | 12/1997 |
| JP | A-2001-272310 | 10/2001 |
| JP | B-3297423 | 4/2002 |
| JP | A-2005-70672 | 3/2005 |
| JP | A-2006-39148 | 2/2006 |
| JP | A-2006-80299 | 3/2006 |
| JP | A-2008-116750 | 5/2008 |
| JP | A-2009-175587 | 8/2009 |
| WO | WO99/23692 A1 | 5/1999 |
| WO | WO 2005/004211 A1 | 1/2005 |

OTHER PUBLICATIONS

Feb. 1, 2011 International Search Report issued in International Application No. PCT/JP2010/069626 (with translation).

*Primary Examiner* — Christopher Young
(74) *Attorney, Agent, or Firm* — Oliff & Berridge, PLC

(57) ABSTRACT

A focus test reticle for measuring focus information includes an outer pattern. The outer pattern has a line pattern composed of a light shielding film extending in the Y direction, a phase shift portion provided on a side in the +X direction of the line pattern and formed to have a line width narrower than the line pattern, a transmitting portion provided on a side in the −X direction of the line pattern and formed to have a line width narrower than the line pattern, a transmitting portion provided on a side in the +X direction of the phase shift portion, and a phase shift portion provided on a side in the −X direction of the transmitting portion. Focus information of a projection optical system is measured at a high measuring reproducibility and a high measuring efficiency.

25 Claims, 13 Drawing Sheets

FOCUS TEST MASK, FOCUS MEASUREMENT METHOD, EXPOSURE METHOD AND EXPOSURE APPARATUS

CROSS-REFERENCES TO RELATED APPLICATIONS

This application claims the benefit of priority of Japanese Patent Application No. 2009-253785 filed on Nov. 5, 2009 and U.S. Provisional Application Ser. No. 61/272,899 filed on Nov. 17, 2009, the entire disclosures of which are incorporated herein by reference in their entireties.

BACKGROUND OF THE INVENTION

1. Field of the Invention

The present invention relates to a focus test mask formed with a pattern for measuring focus information (image plane information) of a projection optical system, a focus measuring method for measuring the focus information of the projection optical system by using the focus test mask, an exposure method, an exposure apparatus provided with the focus test mask, and a method for producing a device using the exposure apparatus.

2. Description of the Related Art

For example, the following procedure is performed in order to measure the focus information as the information about an image plane (best focus position) of a projection optical system in relation to an exposure apparatus used in the lithography step to produce an electronic device (microdevice) such as a semiconductor device or the like. That is, a test mask is arranged on an object plane of the projection optical system, and a substrate or the like is arranged on the image plane of the projection optical system. A predetermined evaluating pattern, which is provided on the test mask, is projected onto the substrate or the like via the projection optical system to measure, for example, a positional deviation amount or positional shift amount of an image of the evaluating pattern.

A method is known as a first conventional measuring method, wherein an evaluating pattern, which is provided with a phase changing portion for changing the phase of an illumination light (illumination light beam) at a space portion wider than the line width of each of line patterns between the line patterns each constructed of two light shielding films, is used, and a substrate coated with a photoresist is exposed with an image of the evaluating pattern formed by a projection optical system. See, for example, Japanese Patent Application Laid-open No. 6-204305. In this procedure, it is possible to determine the defocus amount of the surface of the substrate as well as the position of the image plane from the spacing distance between two line-shaped resist patterns formed on the substrate after the development.

A method is known as a second conventional measuring method, wherein a wafer is exposed in an overlay manner with an image of a diffraction grating-shaped evaluating pattern which includes a plurality of, for example, four or more light shielding lines such that phase distributions provided outside the respective light shielding lines are asymmetrical in the measuring direction and an image of a trim pattern, which is provided to extinguish or erase any image of any unnecessary light shielding line disposed on an outer side, of images of the plurality of light shielding lines. See, for example, Japanese Patent No. 3297423. Also in this case, it is possible to determine the defocus amount of the surface of the wafer from the shift amounts of the images of the plurality of remaining light shielding lines disposed at the center.

A method is known as a third conventional measuring method, wherein the lateral deviation amount is measured for a spatial image of an evaluating pattern which is provided in the vicinity of a plurality of line patterns and which has a phase shift portion wider than the line width of each of the line patterns. See, for example, International Publication No. 2005/004211. Also in this case, it is possible to determine the defocus amount of the light-receiving surface from the lateral deviation amount of images of the respective line patterns.

In the first and third measuring methods of the conventional measuring methods for measuring the focus information, the phase shift portion, which is disposed in contact with the line pattern (or in the vicinity thereof), has a width which is wider than the line width of the line pattern. In order to enhance the measuring sensitivity (lateral deviation amount of image/defocus amount), it is preferable that the line width of the line pattern is narrowed. However, if the line width of the line pattern is narrowed, it is feared that the reproducibility of measurement (measuring reproducibility) might be lowered. Further, in a case that the image of the resist pattern after the development is observed, it is feared that the falling (collapse) or the like of the resist pattern might be caused. Further, if the line width of the line pattern is narrow as described above, in a case that the numerical aperture of the projection optical system is high or large, it is feared that the measuring sensitivity might be lowered especially in a range in which a projection surface of the image of the line pattern is disposed near to the best focus position.

On the other hand, the second conventional measuring method involves such a problem that the efficiency of measurement (measuring efficiency) is low, because it is necessary to perform the exposure twice in order to extinguish the image of the unnecessary pattern.

SUMMARY OF THE INVENTION

Taking the foregoing circumstances into consideration, an object of the present invention is to measure the focus information of a projection optical system at a high reproducibility of measurement or with a high efficiency of measurement.

According to a first aspect, there is provided a focus test mask comprising a test pattern which is to be projected onto an object via a projection optical system;

wherein the test pattern includes: a first light shielding portion which extends in a line form in a first direction and which shields a light; a first phase shift portion which is provided on one side of the first light shielding portion in relation to a second direction perpendicular to the first direction, which extends in a line form in the first direction, which is formed to have a line width in relation to the second direction narrower than a line width of the first light shielding portion, and which changes a phase of the light transmitted therethrough; a first transmitting portion which is provided on the other side of the first light shielding portion in relation to the second direction, which extends in a line form in the first direction, which is formed to have a line width in relation to the second direction narrower than the line width of the first light shielding portion, and through which the light is transmitted; and a second phase shift portion which is provided on a side, of the first transmitting portion, opposite to the first light shielding portion in relation to the second direction, which is formed to have a line width in relation to the second direction wider than the first transmitting portion, and which changes the phase of the light transmitted therethrough.

According to a second aspect, there is provided a focus measuring method for measuring image plane information of a projection optical system, the focus measuring method comprising: a step of arranging the focus test mask according to the first aspect on a side of an object plane of the projection optical system; a step of projecting, onto a measuring surface, an image of the test pattern provided on the focus test mask, the image being formed by the projection optical system; and a step of measuring position information in a measuring direction of the image of the test pattern.

According to a third aspect, there is provided an exposure method comprising: arranging a mask for a device on a side of an object plane of a projection optical system; adjusting a focus position of an image of a pattern of the mask for the device based on the position information of the image of the test pattern measured by using the above-described focus measuring method, the image of the pattern of the mask for the device being formed by the projection optical system; and projecting onto a substrate the image, of the pattern of the mask for the device, of which focus position has been adjusted.

According to a fourth aspect, there is provided an exposure apparatus which illuminates a pattern of a mask with an exposure light and exposes a substrate with the exposure light via the pattern and a projection optical system, the exposure apparatus comprising: a mask stage which holds the focus test mask according to the first aspect; and a controller which causes the projection optical system to project an image of the test pattern of the focus test mask and which determines image plane information of the projection optical system based on position information in a measuring direction of the image of the test pattern.

According to a fifth aspect, there is provided a method for producing a device, the method comprising: transferring a pattern onto a substrate by using the exposure apparatus of the fourth aspect; and processing the substrate, onto which the pattern has been transferred, based on the pattern.

According to the above-described focus test mask and the respective aspects according thereto, the first phase shift portion is provided on one side in the second direction with respect to the first light shielding portion, and the first transmitting portion and the second phase shift portion are provided on the other side in the second direction with respect to the first light shielding portion. Therefore, it is possible to determine the defocus amount with respect to the image plane of the projection optical system as well as the focus information at a high measuring efficiency from the lateral deviation amount of the image of the first light shielding portion in the direction corresponding to the second direction. Further, since the width of the first light shielding portion is wider than the width of the first phase shift portion, it is possible to measure the focus information at a high measuring reproducibility.

DESCRIPTION OF THE PREFERRED EMBODIMENTS

First Embodiment

A first embodiment will be explained below with reference to FIGS. 1 to 8.

Figure 1:
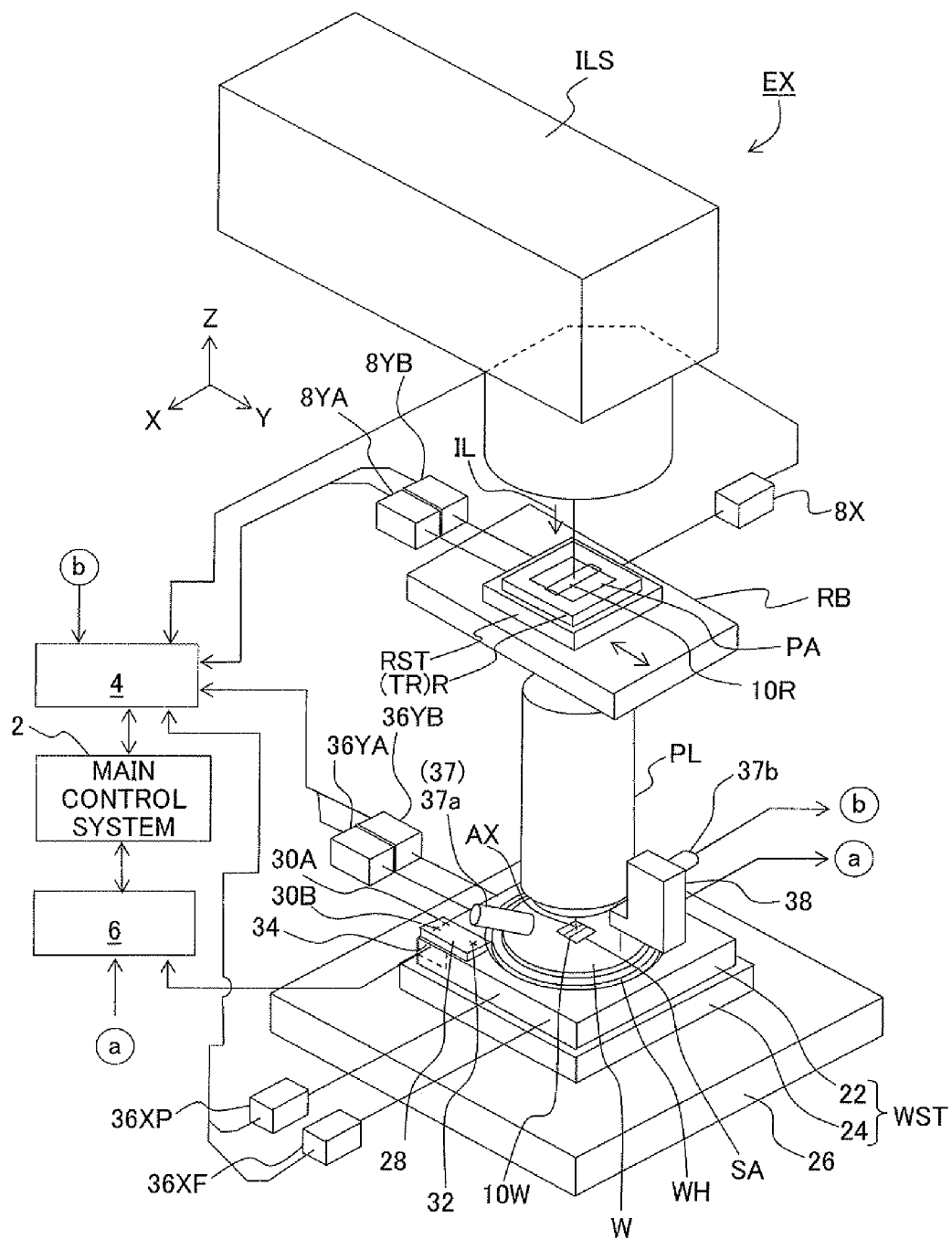
FIG. 1 shows a perspective view illustrating a schematic construction of an exposure apparatus according to an embodiment.

FIG. 1 shows a schematic construction of an exposure apparatus EX of the scanning exposure type constructed of a scanning stepper (scanner) according to the embodiment. With reference to FIG. 1, the exposure apparatus EX includes an exposure light source (not shown), and an illumination optical system ILS which illuminates a reticle R (mask) with an illumination light or illumination light beam (exposure light or exposure light beam) IL radiated from the exposure light source. The exposure apparatus EX further includes a reticle stage RST which is movable while holding the reticle R, a projection optical system PL which projects the illumination light IL exiting from the reticle R onto a wafer W (substrate) coated with a photoresist (photosensitive material), a wafer stage WST which positions and moves the wafer W, a main control system 2 which is constructed of a computer integrally controlling the operation of the entire apparatus, other driving systems, etc.

The following description will be made assuming that the Z axis extends in parallel to an optical axis AX of the projection optical system PL, the X axis and the Y axis extend in two orthogonal directions in a plane (substantially a horizontal plane) perpendicular to the Z axis, and the directions of rotation (inclination) about the axes parallel to the X axis, the Y axis, and the Z axis are designated as θx, θy, and θz directions respectively. In this embodiment, the scanning direction for the reticle R and the wafer W during the scanning exposure is a direction (Y direction) parallel to the Y axis.

An ArF excimer laser (wavelength: 193 nm) is used as the exposure light source. Other than the above, those usable as the exposure light source include an ultraviolet pulsed laser light source such as a KrF excimer laser (wavelength: 248 nm) or the like, a high harmonic wave generating light source of a YAG laser, a high harmonic wave generator of a solid-state laser (a semiconductor laser, etc.), an electric discharge lamp such as a mercury lamp or the like, etc.

As disclosed, for example, in United States Patent Application Publication No. 2003/0025890, the illumination optical system ILS includes a light amount distribution setting optical system which includes a diffraction optical element, etc. and which sets the light amount distribution on a pupil plane in a circular, annular, or multipole area, etc.; an illuminance uniformalizing optical system which includes an optical integrator (for example, a fly's eye lens or a rod integrator), etc.; a reticle blind (variable field stop); a condenser optical system; and the like.

The illumination optical system ILS illuminates a rectangular illumination area 10R, which is elongated or slender in the X direction (non-scanning direction), on a pattern area PA with the illumination light IL at a substantially uniform illuminance on a pattern surface (reticle surface) of the reticle R. With the illumination light IL, a circuit pattern, which is disposed in the illumination area 10R of the reticle R, is projected onto an exposure area 10W (area conjugate with the illumination area 10R) disposed on one shot area SA on the wafer W at a predetermined projection magnification (for example, a reduction magnification of ¼, ⅕, etc.) via the projection optical system PL which is telecentric on the both sides (or telecentric on one side on the wafer side). The wafer W is prepared such that a surface of a disk-shaped base member having a diameter of about 200 to 450 mm constructed of, for example, a silicon semiconductor or SOI (silicon on insulator) is coated with a photoresist (photosensitive material). The projection optical system PL is, for example, of the dioptric system. However, it is also possible to use the catadioptric system, etc.

The reticle R is attracted and held on the reticle stage RST via a reticle holder (not shown). The reticle stage RST is placed on an upper surface of a reticle base RB parallel to the XY plane via an air bearing. The reticle stage RST is movable at a constant velocity in the Y direction on the upper surface, and the positions in the X direction and the Y direction and the angle of rotation in the θz direction are finely adjusted thereby. The two-dimensional position information of the reticle stage RST, which includes at least the positions in the X direction and the Y direction and the angle of rotation in the θz direction, is measured, as an example, by a reticle side interferometer including a laser interferometer 8X for the X axis and two-axis laser interferometers 8YA, 8YB for the Y axis. Obtained measured values are supplied to a stage driving system 4 and the main control system 2. The stage driving system 4 controls the velocity and the position of the reticle stage RST via an unillustrated driving mechanism (a linear motor, etc.) based on the position information and a control information from the main control system 2.

On the other hand, the wafer W is attracted and held on an upper portion of the wafer stage WST via a wafer holder WH. The wafer stage WST includes an XY stage 24, and a Z tilt stage 22 which is disposed thereon and which holds the wafer W. The XY stage 24 is placed on an upper surface of a wafer base 26 parallel to the XY plane via an air bearing. The XY stage 24 is movable on the upper surface in the X direction and the Y direction, and the angle of rotation in the θz direction is corrected, if necessary. The Z tilt stage 22 has, for example, Z driving sections (not shown) which are provided at three portions, which are displaceable in the Z direction, and which are driven individually to control the position (Z position) in the direction of the optical axis AX and the angles of inclination in the θx direction and the θy direction of the upper surface of the Z tilt stage 22 (wafer W).

With reference to FIG. 1, a multipoint autofocus sensor 37, which is of the oblique incidence system, is provided on a side surface of the projection optical system PL. The autofocus sensor 37 is constructed in the same manner as that disclosed, for example, in U.S. Pat. No. 5,448,332, including a light-emitting system 37a and a light-receiving system 37b to measure the focus position at a plurality of points on the surface of the wafer W. The stage driving system 4 drives the Z tilt stage 22 in the autofocus manner so that the surface of the wafer W is coincident with the image plane of the projection optical system PL (image plane having been already determined by a test print, etc.) during the exposure based on the measurement result of the autofocus sensor 37.

The two-dimensional position information of the wafer stage WST (Z tilt stage 22), which includes at least the positions in the X direction and the Y direction and the angle of rotation in the θz direction, is measured, as an example, by a wafer side interferometer including two-axis laser interferometers 36XP, 36XF for the X axis and two-axis laser interferometers 36YA, 36YB for the Y axis. Obtained measured values are supplied to the stage driving system 4 and the main control system 2. The position information is also supplied to an alignment control system 6. The stage driving system 4 controls the two-dimensional position of the XY stage 24 of the wafer stage WST via an unillustrated driving mechanism (a linear motor, etc.) based on the position information and a control information from the main control system 2.

The exposure apparatus EX is of the liquid immersion type which is provided with a local liquid immersion mechanism (not shown) wherein a liquid (pure or purified water, etc.), through which the illumination light IL is transmitted, is supplied to and recovered from a local space between the wafer W and an optical member disposed at an end portion of the projection optical system PL. A mechanism, which is disclosed, for example, in United States Patent Application Publication No. 2007/242247 or European Patent Application Publication No. 1420298, may be used as the local liquid immersion mechanism. The contents of United States Patent Application Publication No. 2007/242247 are incorporated herein by reference.

A wafer alignment system 38 of, for example, the image processing system, which is based on the off-axis system, is supported by an unillustrated frame on the side surface of the projection optical system PL in order to measure a position of an alignment mark on the wafer W. The detection result of the wafer alignment system 38 is supplied to the alignment control system 6. The alignment can be performed for the wafer W in accordance with the detection result. Further, a reference member 28 is fixed in the vicinity of the wafer holder WH on the Z tilt stage 22. Slit patterns 30A, 30B and a reference mark 32 are formed on the reference member 28. A spatial image measuring system 34, which receives a light flux passing through the slit patterns 30A, 30B, is accommodated in the bottom surface of the reference member 28 in the Z tilt stage 22. The detection signal obtained by the spatial image measuring system 34 is supplied to the alignment control system 6. The position of an image of an alignment mark (not shown) of the reticle R can be measured by the spatial image measuring system 34. The alignment can be performed for the reticle R based on the measurement result. Further, the spatial image measuring system 34 is capable of measuring the position of an image of an evaluating pattern of a focus test reticle TR as described later on. The measurement result is supplied from the alignment control system 6 to the main control system 2. Further, the positional relationship (baseline) between the center (exposure center) of the image of the pattern of the reticle R and the detection center of the wafer alignment system 38 can be measured via the reference mark 32 on the reference member 28.

During the exposure, the liquid is supplied to the space between the projection optical system PL and the wafer W, and one shot area of the wafer W is exposed with the image of the pattern in the illumination area 10R of the reticle R formed via the projection optical system PL and the liquid, while the reticle R and the wafer W are synchronously moved in the Y direction at a velocity ratio of the projection magnification. Accordingly, the above-described one shot area is subjected to the scanning exposure with the image of the pattern of the reticle R. After that, the operation in which the wafer W is step-moved in the X direction and the Y direction by driving the wafer stage WST and the scanning exposure operation are repeated. By doing so, the respective shot areas of the wafer W are exposed with the pattern image of the reticle R in the step-and-scan manner based on or using the liquid immersion method.

When the exposure is performed, if any portion, which is defocused while exceeding an allowable range from the image plane of the projection optical system PL, exists in each of the shot areas of the wafer W, then the imaging characteristic of the image with which the portion is exposed is deteriorated, and the yield is lowered, for example, for the semiconductor device to be finally produced. In view of the above, in this embodiment, in order to measure the focus information of the projection optical system PL which is the defocus amount (deviation amount of the Z position from the best focus position) at positions of a plurality of measuring points in a predetermined arrangement in the respective shot areas of the wafer (exposure field of the projection optical system PL) during the scanning exposure, a focus test reticle TR, which is formed with a plurality of evaluating patterns, is loaded on the reticle stage RST instead of the reticle R, and an evaluating wafer is exposed with an image of the pattern of the focus test reticle TR.

Figure 2:
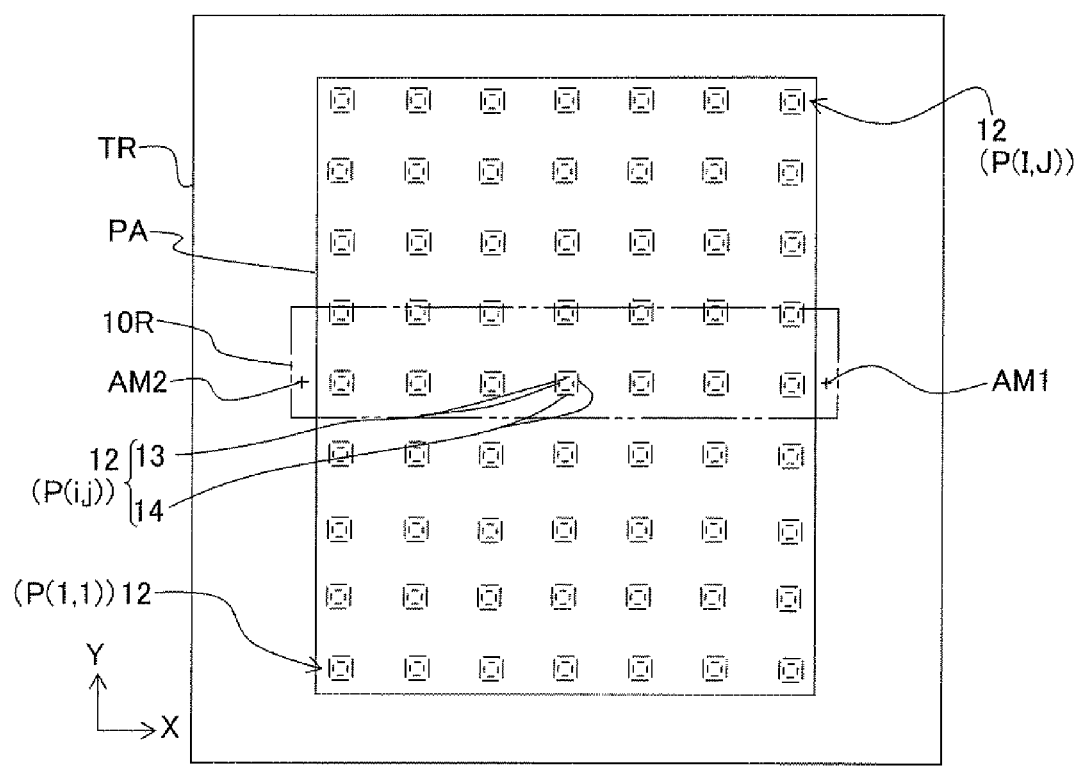
FIG. 2 shows a plan view illustrating a focus test reticle TR in a first embodiment.

FIG. 2 shows the pattern arrangement of the focus test reticle TR in a state that the focus test reticle TR is held on the reticle stage RST shown in FIG. 1. With reference to FIG. 2, measuring points P (i, j), which are disposed, as an example, in I rows in the X direction and J columns in the Y direction, are set in a rectangular pattern area PA provided on a pattern surface (lower surface) of the focus test reticle TR. I and J are integers of not less than 2, and i=1 to I and j=1 to J are given. An evaluating pattern 12 of the so-called bar-in-bar type, which is composed of an outer pattern 14 and an inner pattern 13, is formed at each of the measuring points P (i, j). In this embodiment, the evaluating patterns 12 are arranged in 7 rows in the X direction and 9 columns in the Y direction (I=7, J=9). Further, alignment marks AM1, AM2 are formed at positions which are close to the both sides in the X direction of the pattern area PA and which are included (within) in the width in the X direction of the illumination area 10R.

Figure 3A:
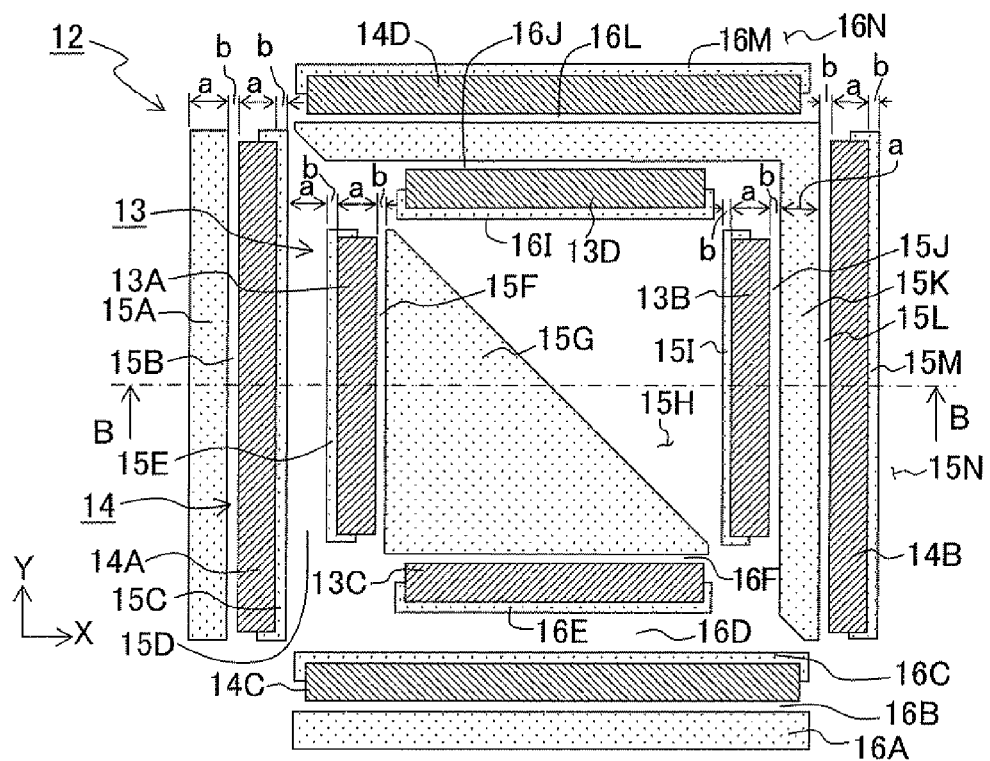
FIG. 3A shows an enlarged plan view illustrating one evaluating pattern 12 of those depicted in FIG. 2.

FIG. 3A shows one of the evaluating patterns 12 shown in FIG. 2. With reference to FIG. 3A, the outer pattern 14 (test pattern) of the evaluating pattern 12 has two line patterns, i.e., a line pattern 14A (first light shielding portion) and a line pattern 14B which have a same shape, which are formed with a predetermined spacing distance in the X direction (measuring direction), and each of which is formed of a rectangular light shielding film (chromium or the like) elongated in the Y direction. Further, the outer pattern 14 includes a phase shift portion 15C (first phase shift portion) and a transmitting portion 15D (second transmitting portion) which are arranged in order in the +X direction on a side of an edge portion in the +X direction of the line pattern 14A as one of the line patterns, and a transmitting portion 15B (first transmitting portion) and a phase shift portion 15A (second phase shift portion) which are arranged in order in the −X direction on a side of an edge portion in the −X direction of the line pattern 14A. The phase shift portion 15C and the phase shift portion 15A are formed so that the phase shift portions 15C and 15A have a same length in the longitudinal direction (Y direction). Note that it is also allowable to form the phase shift portion 15C and the phase shift portion 15A are formed so that the phase shift portions 15C and 15A have different lengths in the longitudinal direction. A line width a in the X direction of the line pattern 14A is larger than a width b in the X direction of each of the phase shift portion 15C and the transmitting portion 15B which are in contact with the line pattern 14A. For example, it is possible to make the line width a of the line pattern 14A be not less than four times the width b of each of the phase shift portion 15C and the transmitting portion 15B as follows.

$$a \geq 4 \times b \quad (1)$$

In the following description, the numerical values of the line width a and the width b are shown as numerical values obtained at the stage of the projected image. For example, in this case, it is preferable that the line width a is not less than 200 nm. As an example, the width b in the X direction of each of the phase shift portion 15C and the transmitting portion 15B is within a range to 50 to 200 nm. In this embodiment, it is preferable that the width b is within a range of 50 to 70 nm. In this range, the width b can be set, for example, to 60 nm. In this case, it is preferable that the line width a in the X direction of the line pattern 14A is 2 to 3 μm. The length in the Y direction of each of the line pattern 14A, the transmitting portion 15B, and the phase shift portion 15C is, as an example, 10 to 15 times the line width a of the line pattern 14A. The spacing distance in the X direction between the line patterns 14A, 14B is set to be longer than the length of the line pattern 14A.

Figure 3B:
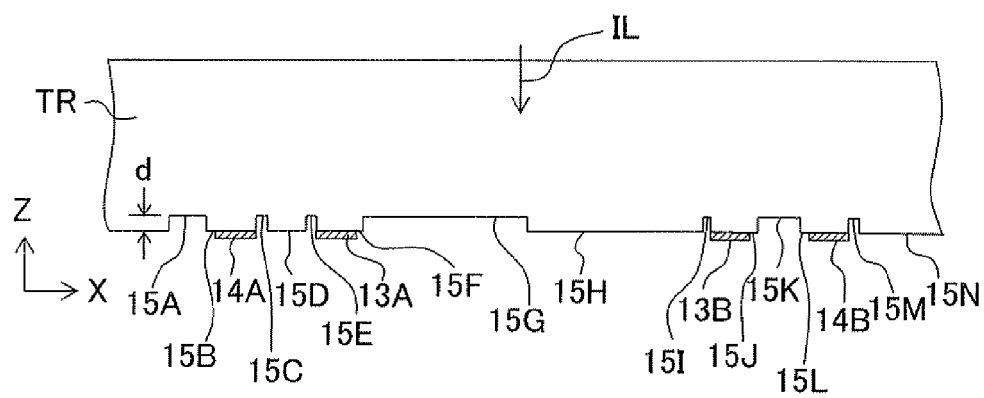
FIG. 3B shows a sectional view taken along a line BB shown in FIG. 3A.

The width a in the X direction of each of the phase shift portion 15A and the transmitting portion 15D is the same as the line width of the line pattern 14A. However, it is sufficient or allowable that the width in the X direction of each of the phase shift portion 15A and the transmitting portion 15D is set to be wider than the width b of each of the transmitting portion 15B and the phase shift portion 15C which are in contact therewith. In other words, it is allowable that the width in the X direction of each of the transmitting portion 15B and the phase shift portion 15C is set to be narrower than the width b of each of the phase shift portion 15A and the transmitting portion 15D which are in contact therewith. As shown in FIG. 3B which is a sectional view taken along a line BB shown in FIG. 3A, the transmitting portions 15B, 15B are portions of a surface (light-exiting surface) of a glass substrate of the focus test reticle TR; and the phase shift portions 15A, 15C are recesses each having a depth d formed, for example, by performing etching on the surface. Namely, the phase shift portions 15A, 15C are formed to be lower than the transmitting portions 15B and 15D with respect to the light-exiting surface. The line patterns 14A, 14B are formed to be higher than the transmitting portions 15B, 15D with respect to the light-exiting surface. In this case, the depth d is set so that a phase θAC of the illumination light IL transmitted through the phase shift portions 15A, 15C proceeds, for example, by 90° with respect to a phase θBD of the illumination light IL transmitted through the transmitting portions 15B, 15D. That is, it is preferable that a phase difference δθ between the phase θBD and the phase θAC is 90°. In a case that the range of the phase difference δθ is represented by 0°≦δθ<360°, it is preferable that the phase difference δθ has an arbitrary value other than 0° and 180°, for example, the phase difference δθ has an arbitrary value other than those of 0° to 30°, 150° to 210°, and 330° to 360°. The reason, why the phase difference δθ is made to have any value other than 180°, for example, the phase difference δθ is made to have any value other than those in the vicinity of 180° as described above, is, for example, that the boundary line between the phase shift portion 15A and the transmitting portion 15B is transferred as a dark line if the phase difference δθ is allowed to have the value of 180° or any value in the vicinity of 180°. Further, the reason, why the phase difference δθ is made to have any value other than those in the vicinity of 0° and 360°, is that the sensitivity is low in relation to the change of the spacing distance between the patterns 13 and 14 with respect to the defocus.

With reference to FIG. 3A, a phase shift portion 15K, a transmitting portion 15L, a phase shift portion 15M, and a transmitting portion 15N, which are constructed approximately in the same manner as the phase shift portion 15A, the transmitting portion 15B, the phase shift portion 15C, and the transmitting portion 15D provided on the both sides of the line pattern 14A, are also provided on the both sides of the line pattern 14B on the +X direction side of the outer pattern 14. However, the phase shift portion 15K has such a shape (L-letter shape in this embodiment) in which a portion having a width a in the X direction and a portion having a width a in the Y direction are connected to each other; and the transmitting portion 15N is such a transmitting portion that the width in the X direction is not less than a.

Further, the outer pattern 14 has phase shift portions 16A, 15K, transmitting portions 16B, 16L, line patterns 14C, 14D, phase shift portions 16C, 16M, and transmitting portions 16D, 16N which are arranged in the Y direction and which are constructed such that the phase shift portions 15A, 15K, the transmitting portions 15B, 15L, the line patterns 14A, 14B, the phase shift portions 15C, 15M, and the transmitting portions 15D, 15N arranged in the X direction are integrally rotated by 90° with the center of the evaluating pattern 12 as the center of rotation.

The inner pattern 13 (auxiliary pattern) of the evaluating pattern 12 has two line patterns, i.e., a line pattern 13A (second light shielding portion) and a line pattern 13B which are arranged symmetrically between the two line patterns 14A, 14B of the outer pattern 14 and each of which is composed of a light shielding film having a short length in the Y direction with the same line width a in the X direction as that of each of the line patterns 14A, 14B. The inner pattern 13 further includes a transmitting portion 15F (third transmitting portion) having a width b and a right-angled triangle-shaped phase shift portion 15G (fourth phase shift portion) which are arranged in order in the +X direction on a side of an edge portion in the direction of the line pattern 13A as one of the line patterns, and a phase shift portion 15E (third phase shift portion) having a width b and a transmitting portion 15D (fourth transmitting portion) having a width a which are arranged in order in the −X direction on a side of an edge portion in the −X direction of the line pattern 13A. The average width in the X direction of the phase shift portion 15G is wider than the width a. The transmitting portion 15D (second transmitting portion and fourth transmitting portion) is commonly used for the inner pattern 13 and the outer pattern 14. The condition of the width a and the width b is the same as that for the outer pattern 14. The phase difference between the phase of the illumination light IL transmitted through the transmitting portions 15D, 15F and the phase of the illumination light IL transmitted through the phase shift portions 15E, 15G can have an arbitrary value other than 0° and 180° in the same manner as the phase difference δθ described above. However, the angle is more preferably 90°.

A transmitting portion 15H, a phase shift portion 15I, a transmitting portion 15J, and a phase shift portion 15K, which are constructed approximately in the same manner as the transmitting portion 15D, the phase shift portion 15E, the transmitting portion 15F, and the phase shift portion 15G provided on the both sides of the line pattern 13A, are also provided on the both sides of the line pattern 13B on the +X direction side of the inner pattern 13. However, the transmitting portion 15H is a right-angled triangle-shaped area, and the phase shift portion 15K (fourth phase shift portion) is commonly used for the phase shift portion (second phase shift portion) of the line pattern 14B.

Further, the inner pattern 13 has transmitting portions 16D, 15H, phase shift portions 16E, 16I, line patterns 13C, 13D, transmitting portions 16F, 16J, and phase shift portions 15G, 16I, which are arranged in the Y direction and which are constructed such that the transmitting portions 15D, 15H, the phase shift portions 15E, 15I, the line patterns 13A, 13B, the transmitting portions 15F, 15J, and the phase shift portions 15G, 15K are integrally rotated by 90° with the center of the evaluating pattern 12 as the center of rotation. A first pattern group is constructed to include the line patterns 14A, 13A, a second pattern group is constructed to include the line patterns 14B, 13B, a third pattern group is constructed to include the line patterns 14C, 13C, and a fourth pattern group is constructed to include the line patterns 14D, 13D.

That is, in the second pattern group, the transmitting portion 15H and the phase shift portion 15I, the line pattern 13B, the transmitting portion 15J, the phase shift portion 15K, the transmitting portion 15L, the line pattern 14B, the phase shift portion 15M, and the transmitting portion 15N extending in the Y direction respectively are arranged in the X direction. In the third pattern group, the phase shift portion 16A, the transmitting portion 16B, the line pattern 14C, the phase shift portion 16C, the transmitting portion 16D, the phase shift portion 16E, the line pattern 13C, and the transmitting portion 16F extending in the line form in the X direction respectively and the phase shift portion 15G are arranged in the Y direction. In the fourth pattern group, the transmitting portion 15H and the phase shift portion 16I, the line pattern 13D, the transmitting portion 16J, the phase shift portion 15K, the transmitting portion 16L, the line pattern 14D, the phase shift portion 16M, and the transmitting portion 16N extending in the X direction respectively are arranged in the Y direction.

Next, an explanation will be made with reference to FIGS. 4A and 4B about the relationship between the defocus amount and the lateral deviation amount in relation to the image of the line pattern 13A of the inner pattern 13 of the evaluating pattern 12 and the image of the line pattern 14A of the outer pattern 14 of the evaluating pattern 12. For the purpose of convenience of the explanation, it is assumed that the projection optical system PL forms an inverted image in the X direction.

Figure 4A:
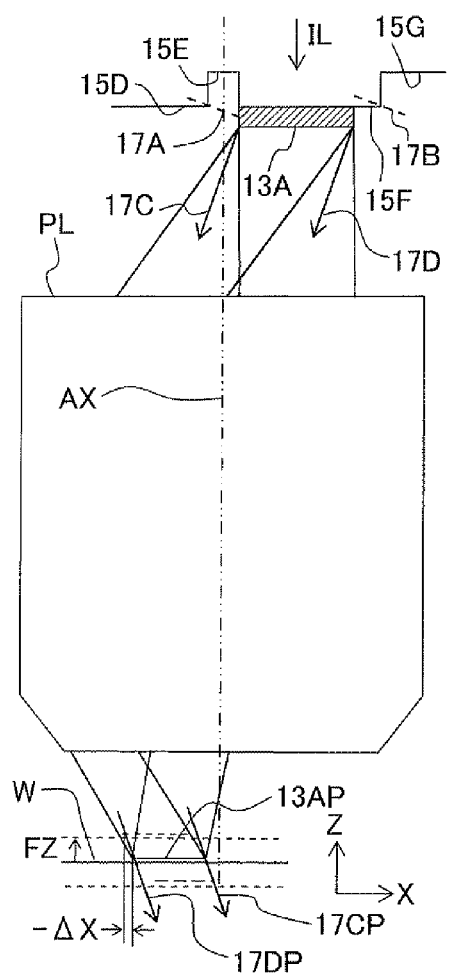
FIG. 4A shows an example of relationship between lateral deviation amount and defocus amount of an image of a line pattern 13A.

As shown in FIG. 4A while being enlarged, a wavefront 17A of the illumination light IL, which is transmitted through the transmitting portion 15D and the phase shift portion 15E disposed on the −X direction side of the line pattern 13A, is inclined substantially clockwise in a ZX plane with respect to an incident light coming into the focus test reticle TR in the Z direction. Similarly, a wavefront 17B of the illumination light IL, which is transmitted through the transmitting portion 15F and the phase shift portion 15G on the +X direction side of the line pattern 13A, is also inclined clockwise in the ZX plane with respect to the incident light coming into the focus test reticle TR in the Z direction. Therefore, central light beams (central lights; hereinafter conveniently referred to as "main light beams (main lights)") 17C, 17D of the light fluxes passing through the both end portions of the line pattern 13A are inclined clockwise with respect to the optical axis AX substantially in parallel. Therefore, main light beams 17CP, 17DP passing through both end portions in the X direction of an image 13AP of the line pattern 13A formed by the projection optical system PL are inclined counterclockwise with respect to the optical axis AX. Therefore, if the surface of the wafer W, which is arranged on the side of the image plane (image plane side) of the projection optical system PL, is defocused by FZ in the +Z direction with respect to the best focus position, the position of the image 13AP is shifted by ΔX in the −X direction.

Figure 4B:
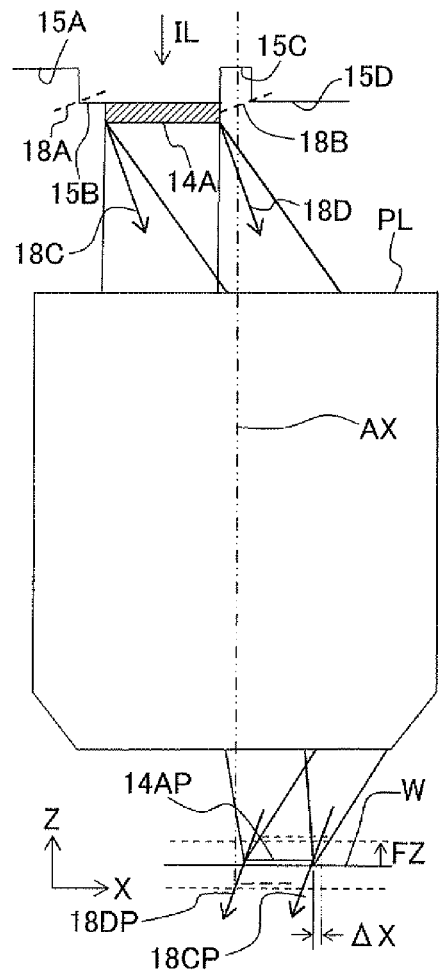
FIG. 4B shows an example of the relationship between lateral deviation amount and defocus amount of an image of a line pattern 14A.

On the other hand, as shown in FIG. 4B while being enlarged, wavefronts 18A, 18B of the illumination light IL, which are transmitted through the phase shift portion 15A and the transmitting portion 15B and the phase shift portion 15C and the transmitting portion 15D arranged on the both sides in the X direction of the line pattern 14A, are inclined substantially counterclockwise. Therefore, main light beams 18C, 18D passing through the both end portions of the line pattern 14A are inclined counterclockwise with respect to the optical axis AX substantially in parallel. Therefore, main light beams 18CP, 18DP passing through both end portions in the X direction of an image 14AP of the line pattern 14A formed by the projection optical system PL are inclined clockwise with respect to the optical axis AX. Therefore, if the surface of the wafer W is defocused by FZ in the +Z direction with respect to the best focus position on the image plane side of the projection optical system PL, the position of the image 14AP is shifted by AX in the +X direction.

Therefore, if the surface of the wafer W is defocused on the image plane side of the projection optical system PL, the image of the line pattern 14A arranged in the X direction of the outer pattern 14 shown in FIG. 3A and the image of the line pattern 13A of the inner pattern 13 are shifted in the opposite direction in relation to the X direction, and the image of the line pattern 14B of the outer pattern 14 and the image of the line pattern 13B of the inner pattern 13 are shifted in the opposite direction in relation to the X direction. Similarly, with respect to the defocus, the image of the line pattern 14C arranged in the Y direction of the outer pattern 14 and the image of the line pattern 13C of the inner pattern 13 are shifted in the opposite direction in relation to the Y direction, and the image of the line pattern 14D of the outer pattern 14 and the image of the line pattern 13D of the inner pattern 13 are shifted in the opposite direction in relation to the Y direction.

Figure 5A:
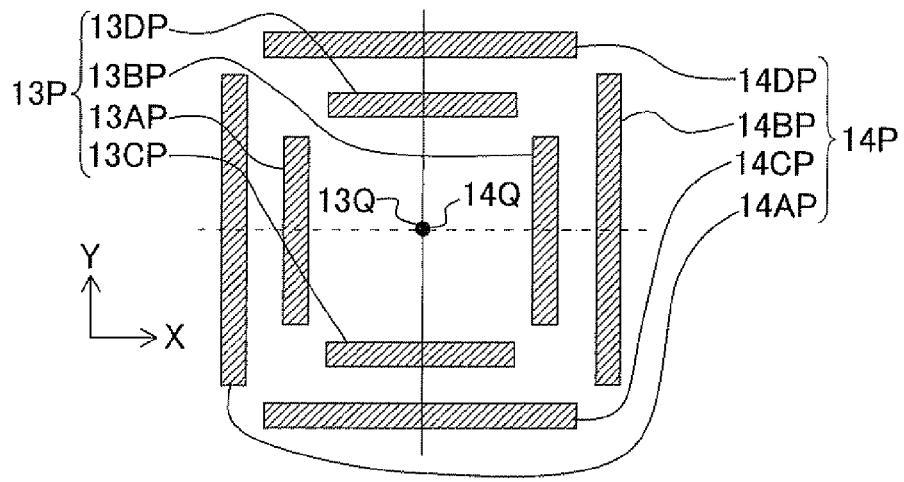
FIGS. 5A, 5B, and 5C show enlarged views illustrating change of positional deviation amount between an image 14P of an outer pattern 14 and an image 13P of an inner pattern 13 respectively.

As a result, when the image of the evaluating pattern 12 formed by the projection optical system PL is projected onto the surface of the wafer and if the surface of the wafer is disposed at the best focus position (image plane), then a center 14Q of an image 14P of the outer pattern 14 of the evaluating pattern 12 (images 14AP to 14DP of the line patterns 14A to 14D) is disposed at the same position as that of a center 13Q of an image 13P of the inner pattern 13 (images 13AP to 13DP of the line patterns 13A to 13D) as shown in FIG. 5A. For the purpose of convenience of the explanation, it is assumed that an image formed by the projection optical system PL is an erecting image in the X direction and the Y direction, for example, in FIGS. 5A to 5C and FIGS. 6B and 6C described later on.

Figure 5B:
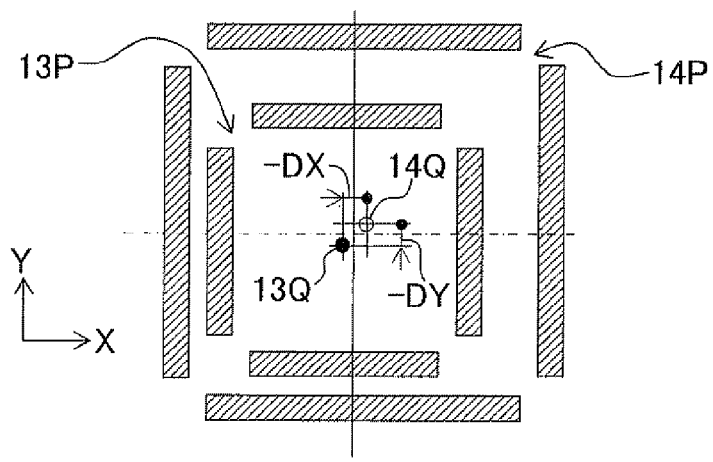
Figure 5C:
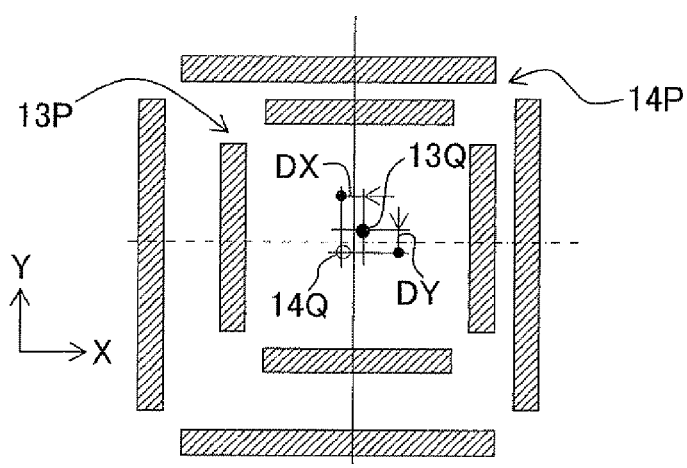

On the other hand, if the surface of the wafer is defocused in the +Z direction, the center 13Q of the image 13P of the inner pattern 13 is shifted by DX in the −X direction and DY in the −Y direction with respect to the center 14Q of the image 14P of the outer pattern 14 as shown in FIG. 5B. Further, if the surface of the wafer is defocused in the −Z direction, the center 13Q of the image 13P of the inner pattern 13 is shifted by DX in the +X direction and DY in the +Y direction with respect to the center 14Q of the image 14P of the outer pattern 14 as shown in FIG. 5C. Therefore, it is appropriate that a following detection rate Rt, which is the ratio between the shift amounts (amounts of change of spacing distance) DX, DY in the X direction and the Y direction of the center 13Q of the image 13P with respect to the center 14Q of the image 14P in relation to the defocus amount FZ of the surface of the wafer, is previously determined, for example, by actual measurement or simulation.

$$Rt = DX/FZ \tag{2A}$$

or $$Rt = DY/FZ \tag{2B}$$

The average value of the expressions (2A) and (2B) may be the detection rate Rt as follows.

$$Rt = \{(DX+DY)/2\}/FZ \tag{3}$$

It is also allowable that the detection rate Rt is not a constant. The detection rate Rt may be a 1st order, 2nd order or higher order function of the defocus amount FZ, or the detection rate Rt may be a function such as an exponential function or the like. If the expression (3) is used, it is possible to determine the defocus amount FZ at the measuring point at which the image is projected as well as the best focus position by projecting the image of the evaluating pattern 12, measuring the shift amounts DX, DY of the image 13P with respect to the image 14P, and dividing the average value of the shift amounts by the detection rate Rt.

Figure 7A:
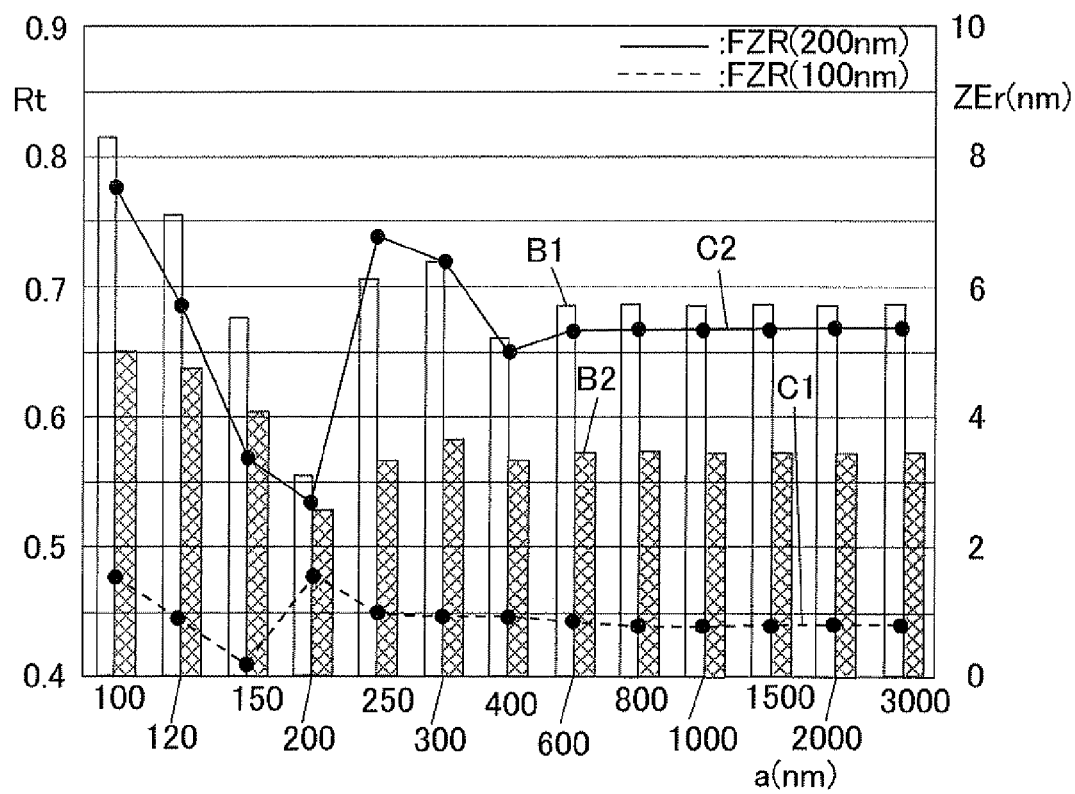
FIG. 7A shows an example of relationship among a line width of the line pattern, a detection rate Rt and a measurement error ZEr.

Next, FIG. 7A shows result of a simulation of the relationship between the line width a (nm) of each of the line patterns 13A to 13D, 14A to 14D of the evaluating pattern 12 shown in FIG. 3A and the detection rate Rt and a predicted maximum measurement error ZEr (nm) of the defocus amount. The condition of the simulation is as follows. That is, the numerical aperture NA of the projection optical system PL is 1, the coherence factor (σ value) of the illumination optical system ILS (illumination light IL) is 0.2, and the width b of, for example, each of the phase shift portions 15C, 15E is 60 nm. The measurement error ZEr is the sum of the error of the defocus amount resulting from the measurement error of the position of the image of the evaluating pattern 12 and the approximation error (nonlinear error) in relation to the expression (3).

With reference to FIG. 7A, a white bar graph B1, which is disposed at the position of each of the line widths a, represents the detection rate Rt when the defocus amount FZ is ±100 nm. A hatched bar graph B2 represents the detection rate Rt when the defocus amount FZ is ±200 nm. A polygonal line C1 of dotted line represents the measurement error ZEr when the defocus amount FZ is ±100 nm. A polygonal line C2 of solid line represents the measurement error ZEr when the defocus amount FZ is ±200 nm. According to FIG. 7A, the values of the detection rate Rt (bar graphs B1, B2) and the measurement error ZEr (polygonal lines C1, C2) are constant when the line width a is not less than 600 nm. Therefore, it is possible to measure the focus information of the projection optical system FL highly accurately.

Figure 7B:
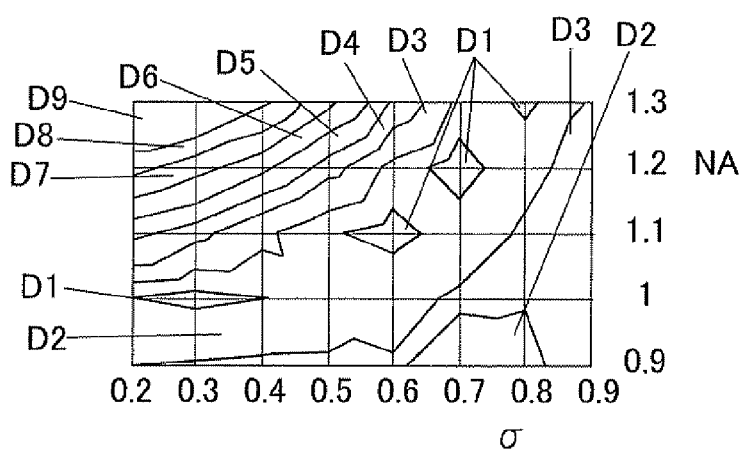
FIG. 7B shows an example of relationship among the numerical aperture of the projection optical system, the coherence factor and the measurement error.

Further, FIG. 7B shows an example of the result obtained when the measurement error ZEr of the defocus amount is evaluated while variously changing the numerical aperture NA of the projection optical system FL and the coherence factor (σ value) of the illumination light IL. In this case, the line width a of each of the line patterns 13A to 13D, etc. is 1000 nm, the width b of the phase shift portion 15C, etc. is 60 nm, the measurement error of the image position of the evaluating pattern 12 is 0.5 nm, and the defocus amount FZ is ±100 nm. In FIG. 7B, the measurement error ZEr of an area D1 surrounded by a curved line is 1 to 1.5 nm, the measurement error ZEr of an area D2 is 1.5 to 2 nm, and the measurement errors ZEr of areas D3, D4, D5, . . . are respectively 2 to 2.5 nm, 2.5 to 3 nm, and 3 to 3.5 nm which are increased by 0.5 nm. According to FIG. 7B, it is appreciated that the measurement error ZEr is approximately not more than 2 nm in the areas D1 and D2, wherein it is possible to measure the defocus amount highly accurately. The range of combination of the numerical aperture NA and the a value is considerably wide in the areas D1, D2. Therefore, it is appreciated that the defocus amount can be measured highly accurately even under various illumination conditions and numerical aperture conditions even in a case that the numerical aperture NA is large such that the numerical aperture arrives at 1.3.

Next, an explanation will be made with reference to a flow chart shown in FIG. 8 about an example of the operation to measure the focus information of the projection optical system PL in the exposure apparatus EX of the embodiment. This operation is periodically executed, for example, during the exposure step under the control of the main control system 2.

Figure 6A:
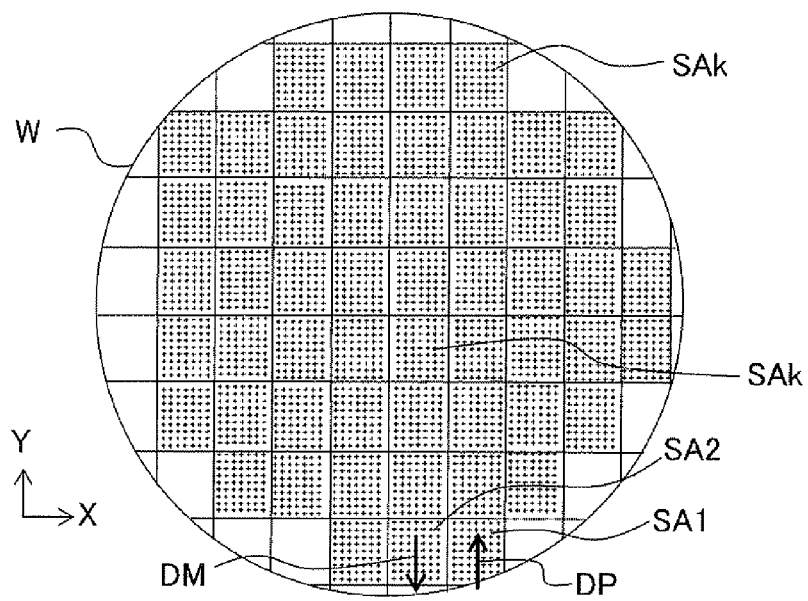
FIG. 6A shows a plan view illustrating a wafer W exposed with an image of the pattern of the focus test reticle TR.
Figure 6B:
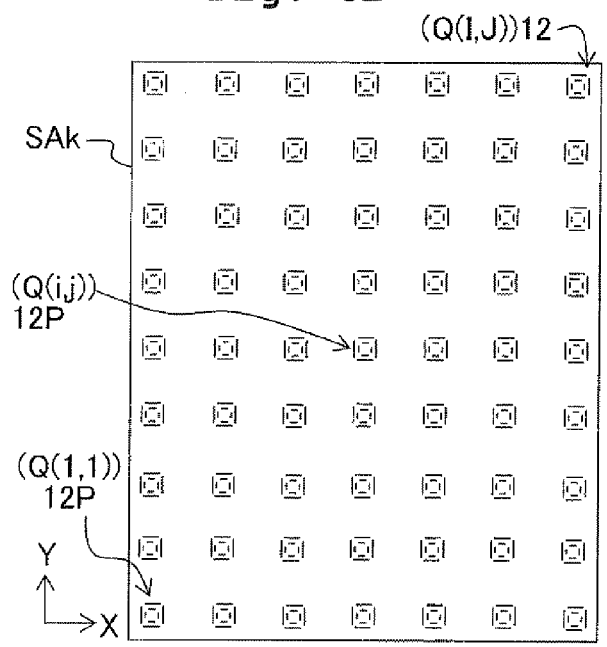
FIG. 6B shows an enlarged plan view illustrating one shot area SAk of those shown in FIG. 6A.
Figure 6C:
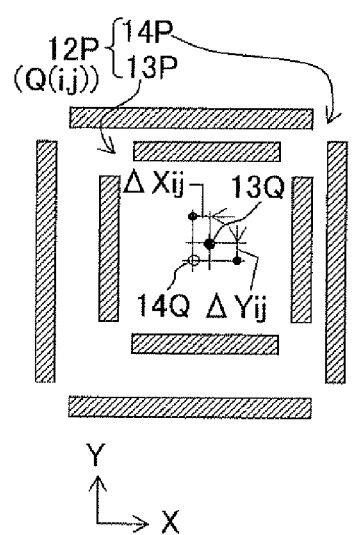
FIG. 6C shows an enlarged plan view illustrating an image 12P of one evaluating pattern 12 of those shown in FIG. 6B.
Figure 8:
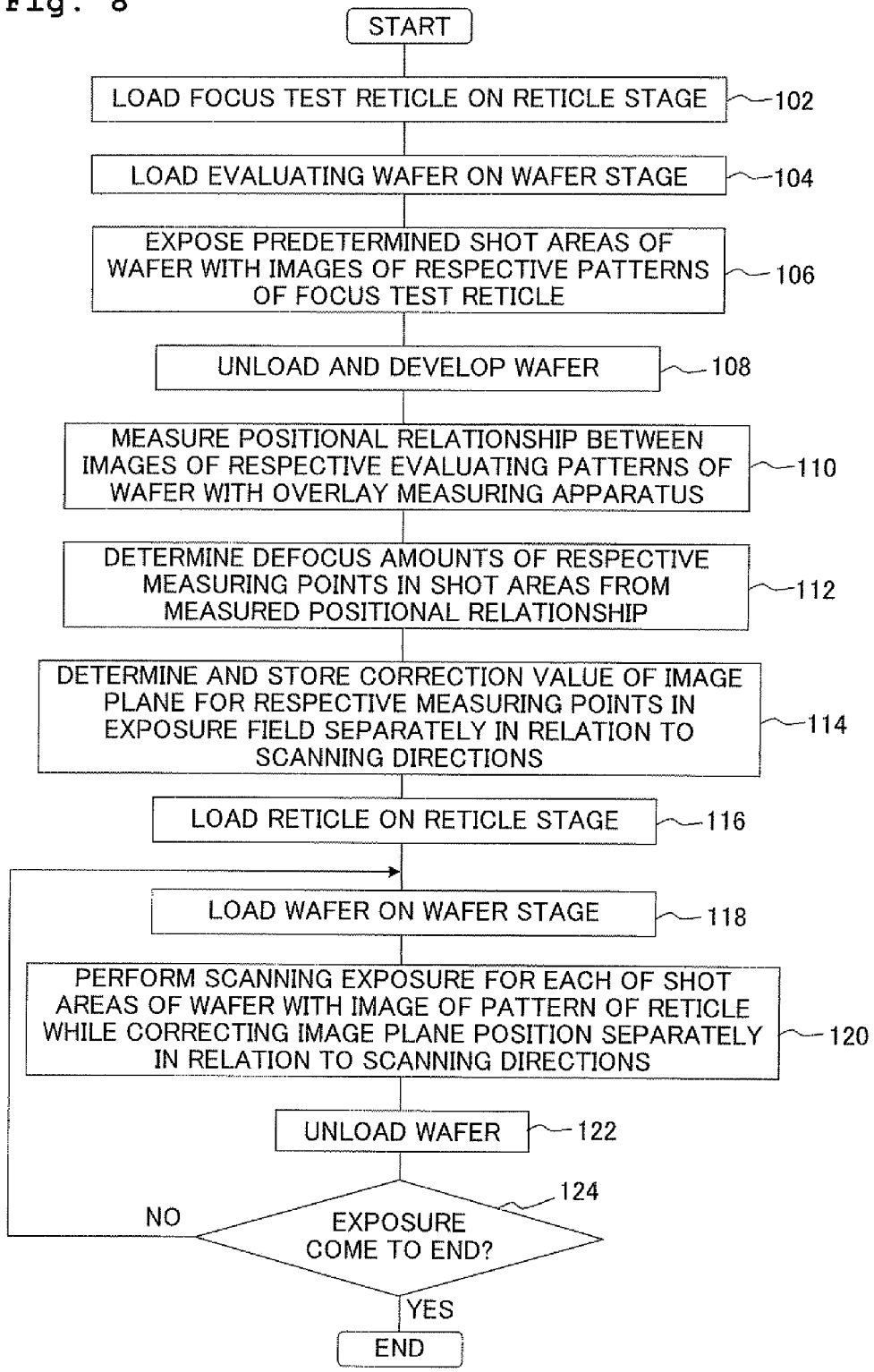
FIG. 8 shows a flow chart illustrating an example of the measuring operation for measuring the focus information.

At first, in Step 102 shown in FIG. 8, the focus test reticle TR is loaded on the reticle stage RST shown in FIG. 1 to perform the alignment therefor. Subsequently, in Step 104, an unexposed evaluating wafer (referred to as "wafer W"), which is coated with the photoresist, is loaded on the wafer stage WST. Subsequently, in Step 106, as shown in FIG. 6A, a large number of shot areas SAk (k=1 to K; K is an integer of not less than 2) of the wafer W is exposed with the image, formed by the projection optical system PL, of the large number of evaluating patterns 12 of the focus test reticle TR shown in FIG. 2 in accordance with the scanning exposure method based on the liquid immersion method. During this process, whether the scanning direction with respect to the exposure area is a +Y direction DP or a −Y direction DM is stored for each of the shot areas SAk. As shown in FIG. 6B while being enlarged, portions, which are disposed in the vicinity of respective measuring points Q (i, j) (i=1 to I; j=1 to J) arranged in the X direction and the Y direction in the respective shot areas SAk, are exposed with the image 12P of the evaluating pattern 12 respectively. The image 12P is composed of the image 14P of the outer pattern 14 and the image 13P of the inner pattern 13 as shown in FIG. 5A.

Subsequently, in Step 108, the exposed wafer W is unloaded from the wafer stage WST, and the wafer W is developed by an unillustrated coater/developer. As a result, the image 13P of the inner pattern 13 and the image 14P of the outer pattern 14, which constitute the image 12P of the evaluating pattern 12, are formed as resist patterns composed of protrusions and recesses as shown in an enlarged view of FIG. 6C in the vicinity of each of the measuring points Q (i, j) in one of the shot areas SAk of the wafer W shown in FIG. 6B.

Subsequently, in Step 110, the wafer W after the development is transported to an overlay measuring apparatus (not shown) to measure shift amount ($\Delta Xij$, $\Delta Yij$) in the X direction and the Y direction (positional relationship between the images) of the center 13Q of the image 13P of the inner pattern 13 with respect to the center 14Q of the image 14P of the outer pattern 14 in relation to the image 12P (FIG. 6C) of the evaluating pattern 12 at each of the measuring points Q (i, j) of one of the shot areas SAk (k=1 to K) of the wafer W by using the overlay measuring apparatus. The measurement results of the shift amounts are supplied to the main control system 2 shown in FIG. 1.

Subsequently, in Step 112, the calculating section included in the main control system 2 divides the average value of the measured shift amounts ($\Delta Xij$, $\Delta Yij$) of the image 12P of the evaluating pattern 12 by the known detection rate Rt of the expression (3) to determine a defocus amount FZij at the concerning measuring point Q (i, j). Further, in Step 114, the calculating section included in the main control system 2 classifies the shot areas SAk of the wafer W into a first group and a second group distinctly based on the scanning directions DP, DM with respect to the exposure area so that a value, which is obtained by interpolating the average value <FZij> of the defocus amounts FZij at the respective measuring points Q (i, j) in the shot areas SAk of the first group, is stored as the correction value for the entire image plane in the exposure field in the scanning direction DP. Similarly, a value, which is obtained by interpolating the average value <FZij> of the defocus amounts FZij at the respective measuring points Q (i, j) in the shot areas SAk of the second group, is stored as the correction value for the entire image plane in the exposure field in the scanning direction DM.

After that, in Step 116, a reticle R for the device is loaded on the reticle stage RST shown in FIG. 1. In Step 118, a wafer coated with the photoresist is loaded on the wafer stage WST. In Step 120, each of the shot areas of the wafer is subjected to the scanning exposure with the image of the pattern of the reticle R, while correcting the S position measured by the autofocus sensor 37 by using the correction values for the image plane provided distinctly in relation to the scanning directions stored in Step 114 for the wafer. During this process, the measured value of the autofocus sensor 37 is corrected so that the measured defocus amount is corrected based on the image of each of the evaluating patterns 12 of the focus test reticle TR. Therefore, the focusing accuracy is improved for the surface of the wafer with respect to the image plane of the projection optical system PL. Therefore, the respective shot areas of the wafer are exposed with the image of the pattern of the reticle R highly accurately.

After that, the exposed wafer is unloaded in Step 122. In Step 124, it is judged whether or not the next exposure objective wafer is present. If any unexposed wafer is present, Steps 118 to 122 are repeated. If any unexposed wafer is absent in Step 124, the exposure step comes to an end.

The effects, etc. of the embodiment are as follows.

(1) The exposure apparatus EX of the embodiment is provided with the focus test reticle TR for measuring the focus information of the projection optical system PL. The evaluating pattern 12, which is formed on the focus test reticle TR, has the outer pattern 14 (test pattern). The outer pattern 14 is provided by arranging, in the X direction, the phase shift portion 15A (second phase shift portion) having the width a in the X direction (second direction), the transmitting portion 15B (first transmitting portion) having the width b narrower than the width a, the line pattern 14A (first light shielding portion) having the line width a, the phase shift portion 15C (first phase shift portion) having the width b, and the transmitting portion 15D (second transmitting portion) having the width a which extend in the line form in the Y direction (first direction) respectively.

According to the focus test reticle TR, the main light beam of the illumination light IL passing through the phase shift portion 15C and the transmitting portion 15D disposed on the +X direction side of the line pattern 14A and the main light beam of the illumination light IL passing through the phase shift portion 15A and the transmitting portion 15B disposed on the −X direction side of the line pattern 14A are inclined in the same direction. Therefore, it is possible to determine, at the high measuring efficiency, the defocus amount of the formation surface of the image plane with respect to the image plane of the projection optical system PL, as well as the focus information, from the lateral deviation amount in the X direction of the image of the line pattern 14A by merely performing the exposure with the image of the evaluating pattern 12 once. Further, since the line width a of the line pattern 14A is wider than the widths b of the phase shift portion 15C and the transmitting portion 15B, it is possible to measure the focus information at the high measuring reproducibility.

(2) In this embodiment, the width b in the X direction of the transmitting portion 15B is same as the width b in the X direction of the phase shift portion 15C; and the lateral deviation amount is approximately same in relation to the both end portions of the image of the line pattern 14A with respect to the defocus, and the line width of the image is approximately constant.

It is also allowable that the width in the X direction of the transmitting portion 15B and the width in the X direction of the phase shift portion 15C are different from each other.

It is not necessarily indispensable to provide the transmitting portion 15D (second transmitting portion).

(3) The evaluating pattern 12 has the inner pattern 13 (auxiliary pattern) for measuring the positional deviation of the image of the outer pattern 14. Therefore, it is possible to highly accurately measure the positional deviation amount of the image of the outer pattern 14 as well as the defocus amount.

It is also possible that the inner pattern 13 is regarded as the test pattern and the outer pattern 14 is regarded as the auxiliary pattern.

(4) The inner pattern 13 is provided by arranging, in the X direction, the transmitting portion 15D (fourth transmitting portion) having the width a in the X direction, the phase shift portion 15E (third phase shift portion) having the width b, the line pattern 13A (second light shielding portion) having the line width a, and the transmitting portion 15F (third transmitting portion) having the width b which extend in the line form in the Y direction respectively, and the phase shift portion 15G (fourth phase shift portion) which has the average width of not less than the width a.

The phase distribution, which is provided on the both sides in the X direction of the line pattern 13A of the inner pattern 13, is symmetrical with the phase distribution which is provided on the both sides in the X direction of the line pattern 14A of the outer pattern 14. Therefore, the direction of the lateral deviation amount of the image of the line pattern 13A, which is provided when the defocus is caused, is opposite to the direction of the lateral deviation amount of the image of the line pattern 14A in relation to the X direction. Therefore, the defocus amount can be measured highly accurately with the two-fold sensitivity while compensating or counterbalancing the offset.

(5) The method for measuring the focus information of the projection optical system PL of the embodiment includes Step 102 of arranging the focus test reticle TR of this embodiment on the object plane of the projection optical system PL; Steps 106, 108 of projecting the image, formed by the projection optical system PL, of the evaluating pattern 12 (outer pattern 14 and inner pattern 13) of the focus test reticle TR onto the surface (measuring surface) of the wafer W; and Step 110 of measuring the spacing distance between the image of the outer pattern 14 and the image of the inner pattern 13 as the position information in the measuring direction of the image of the evaluating pattern 12. Therefore, it is possible to measure the defocus amount with respect to the image plane of the projection optical system PL from the spacing distance (shift amount) between the images.

(6) The step of projecting the image includes Step 108 of developing the photoresist of the wafer W. Therefore, the spacing distance between the images can be measured highly accurately by using, for example, the overlay measuring apparatus.

(7) The exposure apparatus EX of the embodiment is the exposure apparatus which illuminates the pattern of the reticle R with the illumination light IL and exposes the wafer W (substrate) via the pattern and the projection optical system FL with the illumination light IL, the exposure apparatus including the reticle stage RST which holds the focus test reticle TR, and the main control system 2 (controller) which causes the projection optical system FL to project the image of the evaluating pattern 12 of the focus test reticle TR and which determines the correction value (image plane information) of the image plane of the projection optical system FL based on the position information in the measuring direction of the image of the evaluating pattern 12.

Therefore, the focus information of the projection optical system PL can be measured efficiently and highly accurately merely by exchanging the reticle on the reticle stage RST with the focus test reticle TR and exposing the evaluating wafer with the image of the evaluating pattern 12 of the focus test reticle TR.

This embodiment is illustrative of the construction in which the outer pattern 14 is provided with the transmitting portions 15D, 16D. However, such a construction is also allowable that the inner pattern 13 is provided with the transmitting portions 15D, 16D. Similarly, this embodiment is illustrative of the construction in which the outer pattern 14 is provided with the phase shift portion 15K. However, such a construction is also allowable that the inner pattern 13 is provided with the phase shift portion 15K.

The following modifications are available in the embodiment.

(1) In this embodiment, the wafer is exposed with the image of the evaluating pattern 12 of the focus test reticle TR, and the positional relationship of the resist pattern formed after the development is measured by using the overlay measuring apparatus.

However, the exposure apparatus EX is provided with the spatial image measuring system 34. Accordingly, it is also allowable that the image (spatial image) of the evaluating pattern 12 formed by the projection optical system PL is scanned in the X direction and the Y direction with the slit pattern 30A of the spatial image measuring system 34 shown in FIG. 1, and the light intensity distribution of the spatial image is measured by the spatial image measuring system 34. The spacing distance between the image of the outer pattern 14 and the image of the inner pattern 13 of the evaluating pattern 12 is determined from the measurement result, and the defocus amount is determined from the spacing distance. By doing so, it is possible to determine the focus information of the projection optical system PL.

(2) In this embodiment, the focus test reticle TR is exchanged with the reticle R, and the focus test reticle TR is loaded on the reticle stage RST. However, the plurality of evaluating patterns 12, which are formed on the focus test reticle TR, may be formed on a reticle mark plate (not shown) which is fixed to an area disposed closely to the area of the reticle stage RST in which the reticle R is held. In this case, as necessary, by moving the reticle stage RST so as to move the reticle mark plate to the illumination area of the illumination light IL, it is possible to measure the focus information of the projection optical system PL.

Figure 9A:
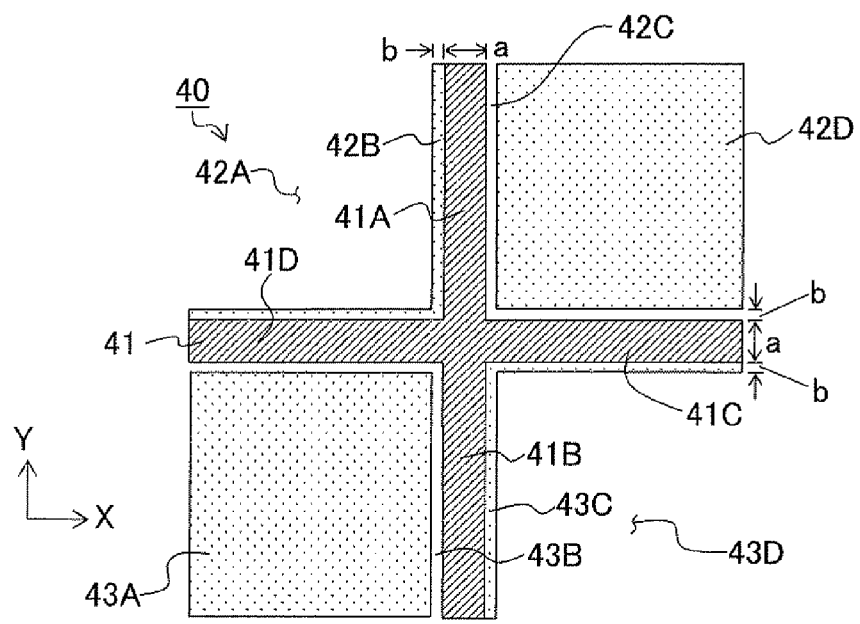
FIG. 9A shows an enlarged plan view illustrating an evaluating pattern 40 of a first modification.
Figure 9B:
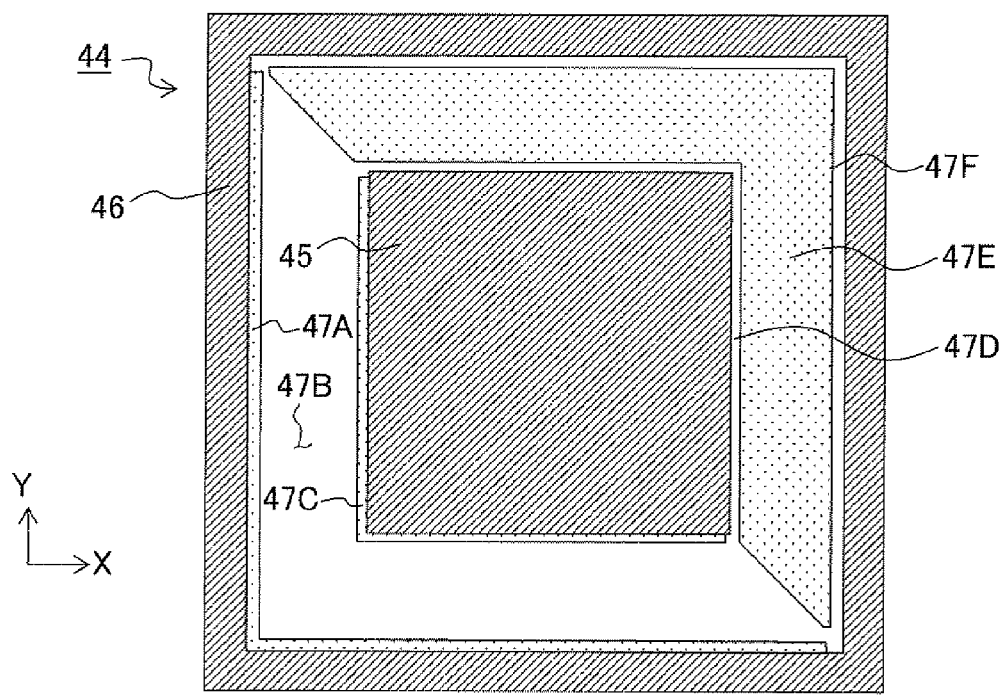
FIG. 9B shows an enlarged plan view illustrating an evaluating pattern 44 of a second modification.

(3) An evaluating pattern 40 of a first modification shown in FIG. 9A or an evaluating pattern 44 of a second modification shown in FIG. 9B may be used in place of the evaluating pattern 12 shown in FIG. 3A.

With reference to FIG. 9A, the evaluating pattern 40 has a cross-shaped light shielding pattern 41 wherein a light shielding film which is elongated in the Y direction and which has a line width a in the X direction and a light shielding film which is elongated in the X direction and which has a line width a in the Y direction are made to intersect at the center. A transmitting portion 42C having a width b and a square phase shift portion 42D are provided in order on the +X direction side of a line portion 41A (first light shielding portion of the test pattern) disposed in the +Y direction with respect to the center of the light shielding pattern 41. A phase shift portion 42B having the width b and a transmitting portion 42A are provided in order on the −X direction side of the line portion 41A. Further, a phase shift portion 43C having the width b and a transmitting portion 43D are provided in order on the +X direction side of a line portion 41B (second light shielding portion of the auxiliary pattern) disposed in the −Y direction with respect to the center of the light shielding pattern 41. A transmitting portion 43B having the width b and a square phase shift portion 43A are provided in order on the −X direction side of the line portion 41B.

Further, a transmitting portion 42C having the width b and a phase shift portion 42D are provided in order on the +Y direction side of a line portion 41C disposed in the +X direction with respect to the center of the light shielding pattern 41. A phase shift portion 43C having the width b and a transmitting portion 43D are provided in order on the −Y direction side of the line portion 41C. Further, a phase shift portion 42B having the width b and a transmitting portion 42A are provided in order on the +Y direction side of a line portion 41D disposed in the −X direction with respect to the center of the light shielding pattern 41. A transmitting portion 43B having the width b and a phase shift portion 43A are provided in order on the −Y direction side of the line portion 41D. The relationship between the line width a and the width b is the same as or equivalent to that of the evaluating pattern 12 shown in FIG. 3A. The amounts of change of the phases of the phase shift portions 42B, 42D, 43A, 43C are the same as or equivalent to that of the phase shift portion 15C shown in FIG. 3A.

Figure 10A:
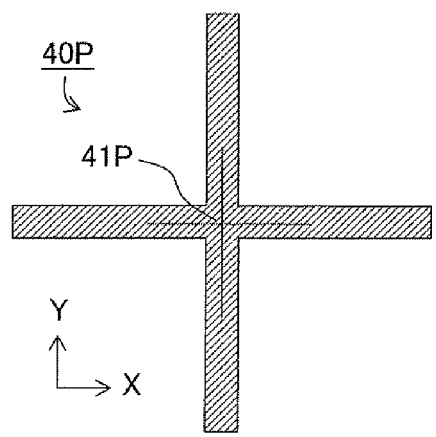
FIGS. 10A and 10B show change of an image 40P of the evaluating pattern of the first modification depending on the defocus amount.
Figure 10B:
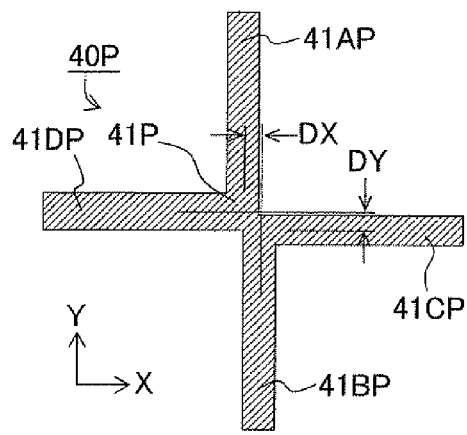

An image 40P of the evaluating pattern 40 of the first modification, which is formed by the projection optical system PL, is an image 41P which is similar to the light shielding pattern 41 as shown in FIG. 10A at the best focus position. On the other side, in a case that the measuring surface is defocused, as shown in FIG. 10B, the image 40P of the evaluating pattern 40 is formed such that a shift amount DX in the X direction is generated between an image 41AP of the line portion 41A and an image 41BP of the line portion 41B, and that a shift amount DY in the Y direction is generated between an image 41DP of the line portion 41D and an image 41CP of the line portion 41C. Therefore, it is possible to determine the defocus amount on the measuring surface from the shift amounts DX, DY.

On the other hand, the evaluating pattern 44 of the second modification shown in FIG. 9B has an outer pattern 46 which is composed of a square frame-shaped light shielding film having the same line width as that of the line portion 41A (see FIG. 9A), and a square inner pattern 45 which is composed of a light shielding film formed at the inside of the outer pattern 46. Further, a transmitting portion 47D, which has the same width as that of the phase shift portion 42B (see FIG. 9A), is provided in the +X direction and the +Y direction of the inner pattern 45 (first light shielding portion); and a phase shift portion 47E, which has a wide width, is provided at the outside of the transmitting portion 47D. A transmitting portion 47F, which has the same width as that of the transmitting portion 47D, is provided between the phase shift portion 47E and inner edge portions in the +X direction and the +Y direction of the outer pattern 46. Further, a phase shift portion 47C, which has the same width as that of the transmitting portion 47D, is provided in the −X direction and the −Y direction of the inner pattern 45; and a transmitting portion 47B is provided at the outside of the phase shift portion 47C. A phase shift portion 47A, which has the same width as that of the phase shift portion 47C, is provided between the transmitting portion 47B and inner edge portions in the −X direction and the −Y direction of the outer pattern 46.

Figure 10C:
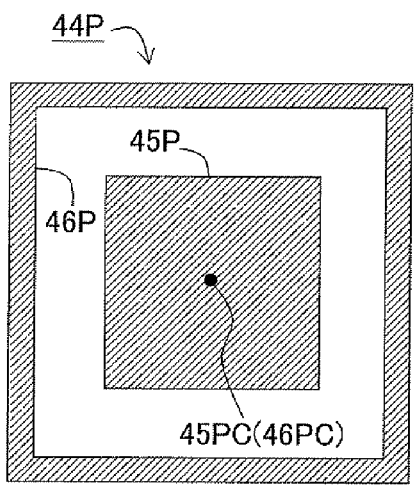
FIGS. 10C and 10D show change of an image 44P of the evaluating pattern of the second modification depending on the defocus amount.
Figure 10D:
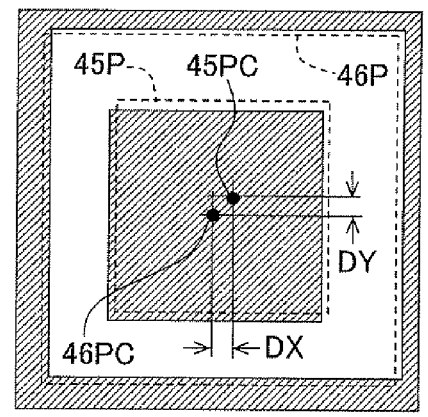

The image 44P of the evaluating pattern 44 of the second modification, which is formed by the projection optical system PL, is provided such that a center 46PC of the inner edge portions of the image of the outer pattern 46 is coincident with a center 45PC of the image 45P of the inner pattern 45 as shown in FIG. 10C at the best focus position. On the other hand, in a case that the measuring surface is defocused, as shown in FIG. 10D, the shift amounts DX, DY are generated in the X direction and the Y direction between the center 46C of the inner edge portions of the image 46P of the outer pattern 46 and the center 45PC of the image 45P of the inner pattern 45 in the image of the evaluating pattern 44. Therefore, it is possible to determine the defocus amount on the measuring surface from the shift amounts DX, DY.

Second Embodiment

Next, a second embodiment will be explained with reference to FIGS. 11A and 11B. Also in this embodiment, the focus information of the projection optical system PL of the exposure apparatus EX shown in FIG. 1 is measured. However, an evaluating pattern, which is formed on a focus test reticle TR, is differently constructed.

Figure 11A:
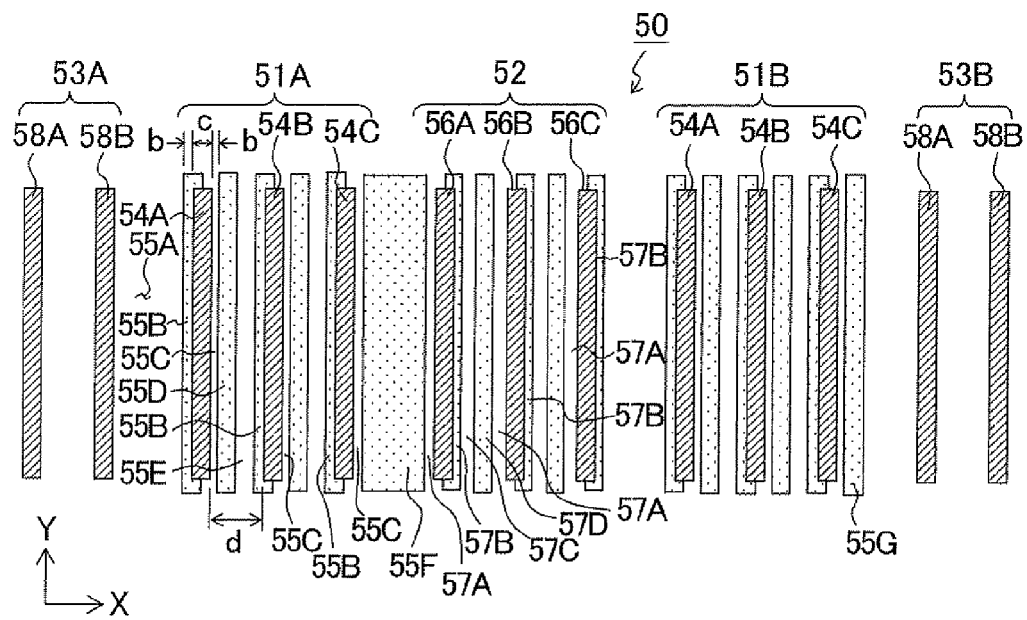
FIG. 11A shows an enlarged plan view illustrating an evaluating pattern 50 of a second embodiment.

FIG. 11A shows an enlarged plan view illustrating an evaluating pattern 50 of this embodiment. With reference to FIG. 11A, the evaluating pattern 50 is constructed by arranging, in the X direction, a first dummy pattern 53A, a first main pattern 51A, a subsidiary pattern 52, a second main pattern 51B, and a second dummy pattern 53B. In this case, each of the dummy patterns 53A, 53B has two line patterns 58A, 58B each of which is composed of a light shielding film elongated in the Y direction and which are arranged in the X direction.

The first main pattern 51A (test pattern) has line patterns 54A, 54B, 54C each of which is composed of a light shielding film having a line width c in the X direction extending in the Y direction and which are arranged in the X direction at spacing distances d that are about three times the line width c, wherein substantially identical phase change portions are provided at the both end portions in the X direction of each of the line patterns 54A to 54C. Representatively, the phase change portion, which is provided for the line pattern 54A (first light shielding portion), has a transmitting portion 55C (first transmitting portion) having a width b and a phase shift portion 55D (second phase shift portion) approximately having a width c which are arranged in order in the +X direction of the line pattern 54A, and a phase shift portion 55B (first phase shift portion) having the width b and a transmitting portion 55A (second transmitting portion) having a width wider than the width b which are arranged in order in the −X direction of the line pattern 54A. The second main pattern 51B has line patterns 54A to 54C and phase change portion provided for each of the line patterns 54A to 54C in the same manner as the first main pattern 51A. A phase shift portion 55G, which is disposed at the end portion in the +X direction, is formed to have a narrow width.

The subsidiary pattern 52 (auxiliary pattern) has line patterns 56A, 56B, 56C which have the same shapes as those of the line patterns 54A to 54C and which are arranged in the same manner as the line patterns 54A to 54C, and substantially identical phase change portions which are provided at the both end portions in the X direction of the line patterns 56A to 56C. Representatively, the phase change portion, which is provided for the line pattern 56A (second light shielding portion), has a phase shift portion 57B (third phase shift portion) having the width b and a transmitting portion 57C (fourth transmitting portion) approximately having the width c which are arranged in order in the +X direction of the line pattern 56A, and a transmitting portion 57A (third transmitting portion) having the width b and a phase shift portion 55F (fourth phase shift portion) having a width wider than the width b which are arranged in order in the −X direction of the line pattern 56A. The phase shift portion 55F is commonly used for the main pattern 51A and the subsidiary pattern 52.

In this embodiment, the line width c in the X direction of each of the line patterns 54A to 54C, 56A to 56C is set to be wider than the width b in the X direction of each of the transmitting portion 55C and the phase shift portion 55B. As an example, the line width c is 80 to 200 nm, and the width b is 50 to 70 nm at the stage of the projected image. Further, as an example, the line width c is 100 nm, and the width b is 60 nm in this case. Further, the phase difference between the phase of the illumination light passing through the phase shift portions 55B, 57B and the phase of the illumination light passing through the transmitting portions 55A, 57C, etc. is set to any value other than 0° and 180°. The phase difference is preferably 90°.

Figure 11B:
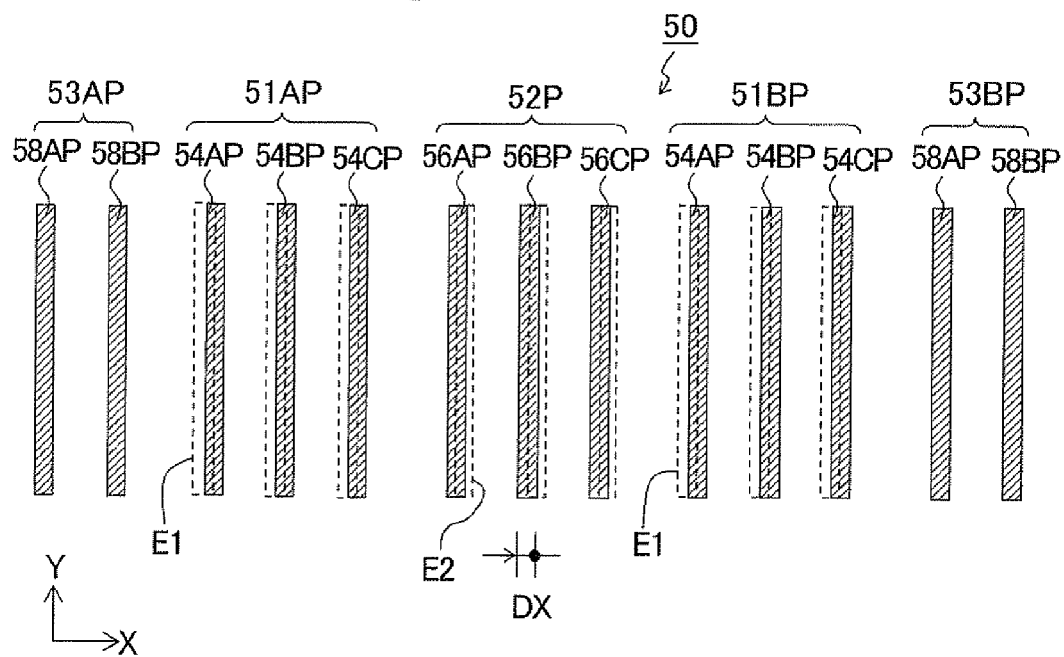
FIG. 11B shows an enlarged plan view illustrating an image of the evaluating pattern 50.

In an image 50P (assumed as an erecting image) of the evaluating pattern 50 formed by the projection optical system PL, as shown in FIG. 11B, an image 51AP of the first main pattern 51A, an image 52P of the subsidiary pattern 52, and an image 51BP of the second main pattern 51B are arranged between images 53AP, 53BP of the dummy patterns (images 58AP, 58BP of the line patterns 58A, 58B). The images 51AP, 51BP are composed of the images 54AP to 54CP of the line patterns 54A to 54C respectively. The image 52P is composed of the images 56AP to 56CP of the line patterns 56A to 56C. In this case, the phase distribution provided at the both end portions in the X direction of the line patterns 54A to 54C and the phase distribution provided at the both end portions in the X direction of the line patterns 56A to 56C are symmetrical with each other in the X direction. Therefore, if the images 51AP, 51BP of the main patterns are moved in the −X direction as depicted by images E1 of dotted lines with respect to the defocus of the measuring surface, the image 52P of the subsidiary pattern is moved in the +X direction (opposite direction) as depicted by an image E2 of dotted lines.

Therefore, the defocus amount of the measuring surface can be determined by measuring, as an example, the shift amount DX between the central position (average position of the respective centers) in the X direction of the images 54AP to 54CP of the six line patterns of the images 51AP, 51BP of the main patterns and the central position in the X direction of the images 56AP to 56CP of the three line patterns of the image 52P of the subsidiary pattern. Further, in this embodiment, the positions of the images of the dummy patterns 53A, 53B are usable, for example, when the positional deviation amounts of the images of the main patterns 51A, 51B and the positional deviation amount of the image of the subsidiary pattern 52 are individually evaluated.

In this embodiment, the numbers of the line patterns 54A to 54C constructing the main patterns 51A, 51B and the number of the line patterns 56A to 56C constructing the subsidiary pattern 52 may be at least one. It is not necessarily indispensable to provide the dummy patterns 53A, 53B. It is also possible to omit, for example, the second main pattern 51B.

Figure 12A:
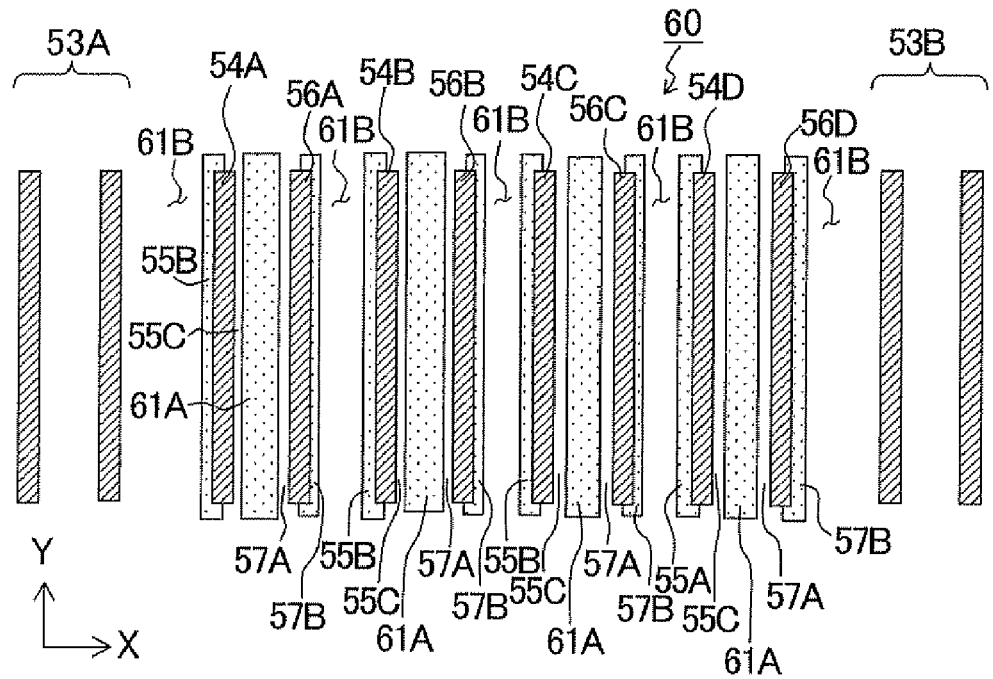
FIG. 12A shows an enlarged plan view illustrating an evaluating pattern 60 of a modification of the second embodiment.

Next, FIG. 12A shows an evaluating pattern 60 of a modification of the second embodiment. With reference to FIG. 12A in which the same reference numerals are affixed to the portions corresponding to those shown in FIG. 11A, the evaluating pattern 60 has dummy patterns 53A, 53B which are arranged at the both end portions in the X direction. Line patterns 54A, 56A, 54B, 56B, 54C, 56C, 54D, 56D, which have identical shapes, are arranged in the X direction between the dummy patterns 53A, 53B at spacing distances which are approximately two times to three times the line width.

A transmitting portion 55C (first transmitting portion) and a phase shift portion 61A (second phase shift portion) having a wide width are arranged on the +X direction side of the line patterns 54A to 54D (first light shielding portion), and a phase shift portion 55B (first phase shift portion) and a transmitting portion 61B (second transmitting portion) having a wide width are arranged on the −X direction side of the line patterns 54A to 54D. A phase shift portion 57B (third phase shift portion) and a transmitting portion 61B (fourth transmitting portion) having a wide width are arranged on the +X direction side of the line patterns 56A to 56D (second light shielding portion), and a transmitting portion 57A (third transmitting portion) and the phase shift portion 61A (fourth phase shift portion) are arranged on the −X direction side of the line patterns 56A to 56D. The phase shift portion 61A is commonly used for the test pattern including the line patterns 54A to 54D and the auxiliary pattern including the line patterns 56A to 56D.

Figure 12B:
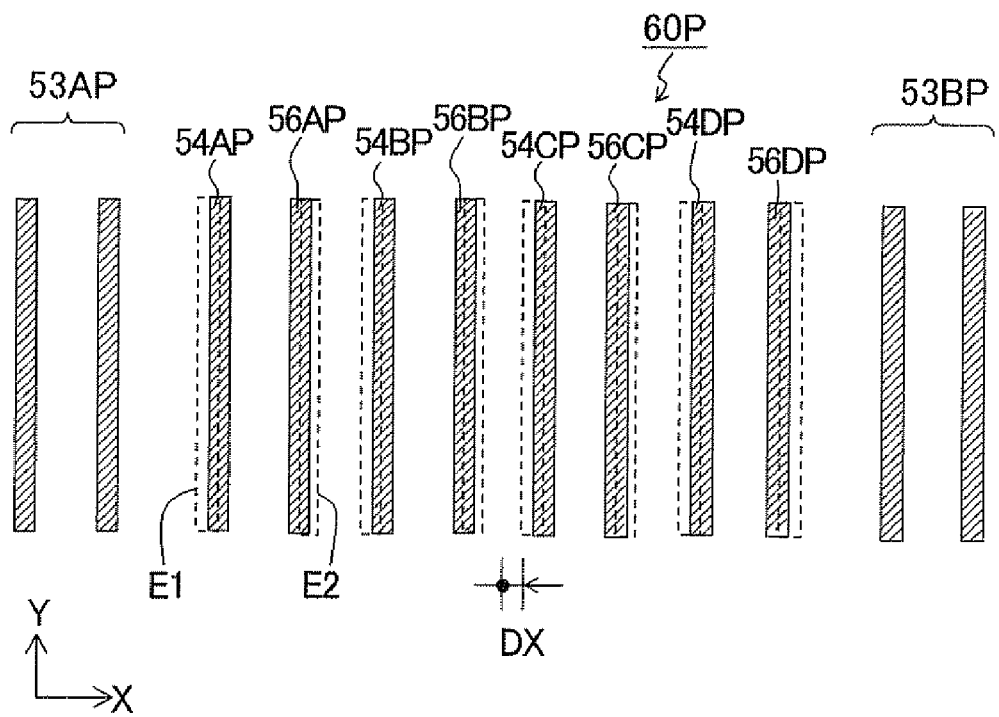
FIG. 12B shows an enlarged plan view illustrating an image of the evaluating pattern 60.

In an image 60P (assumed as an erecting image) of the evaluating pattern 60 formed by the projection optical system PL, as shown in FIG. 12B, images 54AP to 54DP of the line patterns 54A to 54D and images 56AP to 56DP of the line patterns 56A to 56D are alternately formed in the X direction between the images 53AP, 53BP of the dummy patterns. In this case, the phase distribution at the both end portions in the X direction of the line patterns 54A to 54D and the phase distribution at the both end portions in the X direction of the line patterns 56A to 56D are symmetrical with each other. Therefore, if the images 54AP to 54DP are moved in the −X direction as depicted by images E1 of dotted lines with respect to the defocus of the measuring surface, the images 56AP to 56DP are moved in the +X direction (opposite direction) as depicted by images E2 of dotted lines.

Therefore, the defocus amount of the measuring surface can be determined by measuring, as an example, the shift amount DX between the central position (average position of the respective centers) in the X direction of the images 54AP to 54DP of the four line patterns and the central position in the X direction of the images 56AP to 56DP of the four line patterns.

In this embodiment, the numbers of the line patterns 54A to 54D and 56A to 56D may be at least one respectively. It is not necessarily indispensable to provide the dummy patterns 53A, 53B.

Although the foregoing explanation has been made as exemplified by the local liquid immersion exposure apparatus provided with a local liquid immersion mechanism, it is possible to apply the present invention also to an exposure apparatus of such a liquid immersion type that immerses an object entirely in the liquid, in addition to a local liquid immersion exposure apparatus in which the liquid is intervened only in a local liquid immersion space between the projection optical system and an object (a part of the object). Further, it is also possible to apply the present invention to an exposure apparatus of such a liquid immersion type that maintains the liquid immersion area between the projection optical system and the substrate with an air curtain around the liquid immersion area. The present invention is applicable to not only a case of performing the exposure by using the exposure apparatus of the liquid immersion type but also a case for measuring the focus information for a projection optical system of an exposure apparatus of the dry exposure type which does not allow any liquid to intervene. The present invention is also applicable to a case that the focus information is measured for a projection optical system in an exposure apparatus of the full field exposure type such as a stepper or the like other than the exposure apparatus of the scanning exposure type.

The present invention may be also applicable to a case of using a multi-stage type exposure apparatus or exposure method provided with a plurality of substrate stages as disclosed, for example, in U.S. Pat. Nos. 6,590,634, 5,969,441 and 6,208,407 or to a case of using an exposure apparatus or exposure method provided with a measuring stage provided with a measuring member (for example, reference member and/or sensor, etc.) as disclosed, for example, in International Publication No. 1999/23692 and U.S. Pat. No. 6,897,963.

Figure 13:
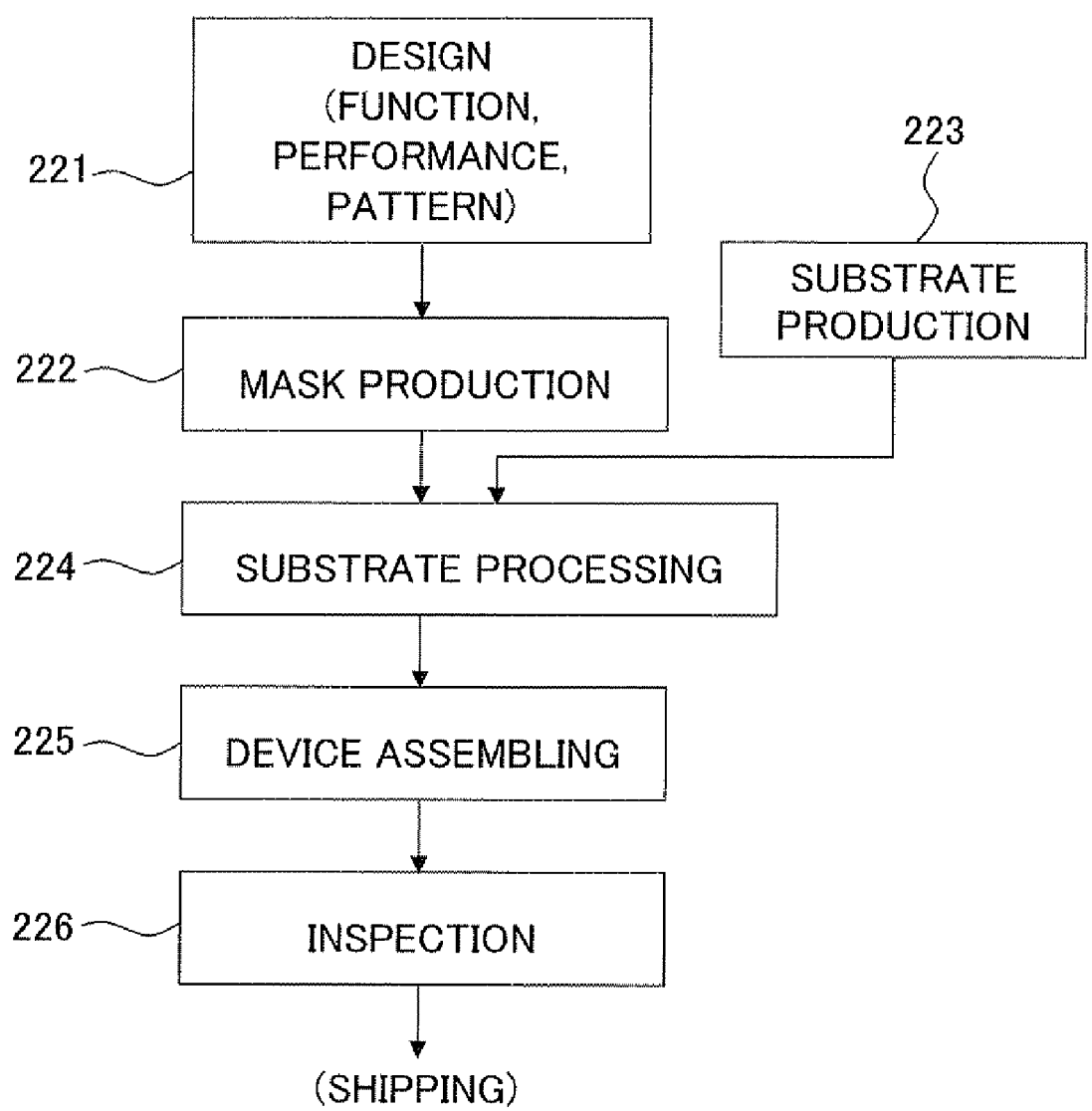
FIG. 13 shows a flow chart illustrating a process for producing an electronic device such as a semiconductor device, etc. by using the exposure apparatus of the embodiment.

In a case that an electronic device such as a semiconductor device is produced by using the exposure apparatus EX of the respective embodiments described above (or by an exposure method with the exposure apparatus EX), as shown in FIG. 13, the electronic device is produced by performing a step 221 of designing the function and the performance of the electronic device; a step 222 of manufacturing a mask (reticle) based on the designing step; a step 223 of producing a substrate (wafer) as a base material for the device and coating a resist on the substrate (wafer); a substrate-processing step 224 including a step of exposing the substrate (photosensitive substrate) with a pattern of the mask by the exposure apparatus or exposure method of the embodiment described above, a step of developing the exposed substrate, a step of heating (curing) and etching the developed substrate, etc.; a step 225 of assembling the device (including processing processes such as a dicing step, a bonding step, and a packaging step); an inspection step 226; and the like.

Accordingly, the substrate-processing step 224 of the method for producing the device includes the exposure step of forming a predetermined pattern onto the substrate by using the exposure apparatus or exposure method of the embodiment described above, and the processing step of processing the substrate onto which the pattern has been formed. According to the exposure apparatus or exposure method, it is possible to efficiently measure the focus information of the projection optical system at a high reproducibility of measurement. Therefore, it is possible to produce the electronic device highly precisely by controlling the auto focus, etc. based on the measurement results.

The present invention is not limited to the application of the exposure apparatus for producing the semiconductor device. The present invention is also widely applicable to an exposure apparatus for a display apparatus or device including a plasma display, a liquid crystal display element formed on the square or rectangular glass plate, etc. and to an exposure apparatus for producing various devices including an image pickup element (CCD or the like), a micromachine, a thin film magnetic head, MEMS (Microelectomechanical Systems), a DNA chip, etc. Further, the present invention is also applicable to an exposure step when a mask (photomask, reticle, etc.), which is formed with mask patterns of various devices, is produced by using the photolithography step.

The present invention is not limited to the embodiments described above, which may be embodied in other various forms within a scope without deviating from the gist or essential characteristics of the present invention.

What is claimed is:

1. A focus test mask comprising a test pattern which is to be projected onto an object via a projection optical system,
wherein the test pattern includes:
a first light shielding portion which extends in a line form in a first direction and which shields a light;
a first phase shift portion which is provided on one side of the first light shielding portion in relation to a second direction perpendicular to the first direction, which extends in a line form in the first direction, which is formed to have a line width in relation to the second direction narrower than a line width of the first light shielding portion, and which changes a phase of the light transmitted therethrough;
a first transmitting portion which is provided on the other side of the first light shielding portion in relation to the second direction, which extends in a line form in the first direction, which is formed to have a line width in relation to the second direction narrower than the line width of the first light shielding portion, and through which the light is transmitted; and
a second phase shift portion which is provided on a side of the first transmitting portion opposite to the first light shielding portion in relation to the second direction, which is formed to have a line width in relation to the second direction wider than the first transmitting portion, and which changes the phase of the light transmitted therethrough.

2. The focus test mask according to claim 1, wherein the line width of the first transmitting portion in the second direction is same as the line width of the first phase shift portion in the second direction.

3. The focus test mask according to claim 1, wherein the test pattern includes a second transmitting portion which is provided on a side of the first phase shift portion opposite to the first light shielding portion in relation to the second direction, which is formed to have a line width in relation to the second direction wider than the first phase shift portion, and through which the light is transmitted.

4. The focus test mask according to claim 3, wherein the line width of the second transmitting portion in the second direction is same as the line width of the second phase shift portion in the second direction.

5. The focus test mask according to claim 1, wherein the line width of the first light shielding portion in the second direction is at least four times the line width of the first phase shift portion in the second direction.

6. The focus test mask according to claim 3, wherein the line width of the first light shielding portion in the second direction is same as the line width of the second transmitting portion in the second direction and the line width of the second phase shift portion in the second direction.

7. The focus test mask according to claim 1, wherein an image, of the first light shielding portion, which is formed by the projection optical system has a line width in the second direction which is at least 200 nm.

8. The focus test mask according to claim 1, further comprising an auxiliary pattern which is provided to measure a positional deviation of an image of the test pattern.

9. The focus test mask according to claim 8, wherein the auxiliary pattern includes:
   a second light shielding portion which extends in a line form in the first direction and which shields the light;
   a third transmitting portion which is provided on one side of the second light shielding portion in relation to the second direction, which extends in a line form in the first direction, which is formed to have a line width in relation to the second direction narrower than a line width of the second light shielding portion, and through which the light is transmitted;
   a third phase shift portion which is provided on the other side of the second light shielding portion in relation to the second direction, which extends in a line form in the first direction, which is formed to have a line width in relation to the second direction narrower than the line width of the second light shielding portion, and which changes the phase of the light transmitted therethrough; and
   a fourth phase shift portion which is provided on a side of the third transmitting portion opposite to the second light shielding portion in relation to the second direction, which is formed to have a line width in relation to the second direction wider than the third transmitting portion, and which changes the phase of the light transmitted therethrough.

10. The focus test mask according to claim 9, wherein the test pattern includes a second transmitting portion which is provided on a side of the first phase shift portion opposite to the first light shielding portion in relation to the second direction, which is formed to have a line width in relation to the second direction wider than the first phase shift portion, and through which the light is transmitted; and
   the auxiliary pattern includes a fourth transmitting portion which is provided on a side of the third phase shift portion opposite to the second light shielding portion in relation to the second direction, which is formed to have a line width in relation to the second direction wider than the third phase shift portion, and through which the light is transmitted.

11. The focus test mask according to claim 10, further comprising a plurality of pattern groups which are composed of a plurality of pieces of the test pattern and a plurality of pieces of the auxiliary pattern;
   wherein a first pattern group of the plurality of pattern groups is formed by arranging the test pattern and the auxiliary pattern, from one side in the second direction, in an order of the second transmitting portion, the first phase shift portion, the first light shielding portion, the first transmitting portion, the second phase shift portion, the fourth phase shift portion, the third transmitting portion, the second light shielding portion, the third phase shift portion, and the fourth transmitting portion.

12. The focus test mask according to claim 11, wherein the second phase shift portion also serves as the fourth phase shift portion.

13. The focus test mask according to claim 11, wherein a second pattern group of the plurality of pattern groups is formed by arranging the second transmitting portion, the first phase shift portion, the first light shielding portion, the first transmitting portion, the second phase shift portion, the fourth phase shift portion, the third transmitting portion, the second light shielding portion, the third phase shift portion, and the fourth transmitting portion in this order from the other side in the second direction.

14. The focus test mask according to claim 11, wherein a third pattern group of the plurality of pattern groups is formed by arranging the second transmitting portion, the first phase shift portion, the first light shielding portion, the first transmitting portion, the second phase shift portion, the fourth phase shift portion, the third transmitting portion, the second light shielding portion, the third phase shift portion, and the fourth transmitting portion in this order from one side in the first direction.

15. The focus test mask according to claim 11, wherein a fourth pattern group of the plurality of pattern groups is formed by arranging the second transmitting portion, the first phase shift portion, the first light shielding portion, the first transmitting portion, the second phase shift portion, the fourth phase shift portion, the third transmitting portion, the second light shielding portion, the third phase shift portion, and the fourth transmitting portion in this order from the other side in the first direction.

16. The focus test mask according to claim 1, wherein the test pattern is formed on a light-exiting surface of the focus test mask;
   the first light shielding portion is formed to be higher than the first transmitting portion; and
   the first and second phase shift portions are formed to be lower than the first transmitting portion.

17. A focus measuring method for measuring image plane information of a projection optical system, the focus measuring method comprising:
   arranging the focus test mask as defined in claim 1 on a side of an object plane of the projection optical system;
   projecting, onto a measuring surface, an image of the test pattern provided on the focus test mask, the image being formed by the projection optical system; and
   measuring position information in a measuring direction of the image of the test pattern.

18. The focus measuring method according to claim 17, wherein the focus test mask includes an auxiliary pattern which is provided to measure a positional deviation of the image of the test pattern; and
   the position information in the measuring direction of the image of the test pattern includes a spacing distance in the measuring direction between the image of the test pattern and an image of the auxiliary pattern.

19. The focus measuring method according to claim 17, wherein the projecting the image of the test pattern formed by the projection optical system includes projecting the image onto a photosensitive substrate and developing the photosensitive substrate.

20. The focus measuring method according to claim 18, wherein the measuring the position information in the measuring direction of the image of the test pattern and the image of the auxiliary pattern includes measuring a light intensity distribution in the measuring direction of the image by using a spatial image measuring system.

21. An exposure method comprising:
   arranging a mask for a device on a side of an object plane of a projection optical system;
   adjusting a focus position of an image of a pattern of the mask for the device based on the position information of the image of the test pattern measured by using the focus measuring method as defined in claim 17, the image of the pattern of the mask for the device being formed by the projection optical system; and projecting onto a substrate the image, of the pattern of the mask for the device, of which focus position has been adjusted.

22. An exposure apparatus which illuminates a pattern of a mask with an exposure light and exposes a substrate with the exposure light via the pattern and a projection optical system, the exposure apparatus comprising:

- a mask stage which holds the focus test mask as defined in claim 1; and
- a controller which causes the projection optical system to project an image of the test pattern of the focus test mask and which determines image plane information of the projection optical system based on position information in a measuring direction of the image of the test pattern.

23. The exposure apparatus according to claim 22, wherein the focus test mask is held in an area which is located closely to an area of the mask stage in which the mask is held.

24. The exposure apparatus according to claim 22, further comprising a spatial image measuring system which detects the image of the test pattern formed by the projection optical system.

25. A method for producing a device, the method comprising:

- transferring a pattern onto a substrate by using the exposure apparatus as defined in claim 22; and
- processing the substrate, onto which the pattern has been transferred, based on the pattern.

* * * * *